(12) United States Patent
Friedrich et al.

(10) Patent No.: US 10,027,275 B2
(45) Date of Patent: Jul. 17, 2018

(54) SOLAR CELL MODULE AND ROOF STRUCTURE

(71) Applicant: KANEKA CORPORATION, Osaka-shi, Osaka (JP)

(72) Inventors: Stefan Friedrich, Brussels-Capital (BE); Yuta Minami, Kawanishi (JP); Thomas J Moran, Tory, MI (US); Fumihiro Tanikawa, Ibaraki (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 0 days.

(21) Appl. No.: 15/316,163

(22) PCT Filed: Jun. 6, 2014

(86) PCT No.: PCT/JP2014/065044
§ 371 (c)(1),
(2) Date: Dec. 3, 2016

(87) PCT Pub. No.: WO2015/186237
PCT Pub. Date: Dec. 10, 2015

(65) Prior Publication Data
US 2017/0126170 A1    May 4, 2017

(51) Int. Cl.
*H02S 20/25* (2014.01)
*E04D 1/30* (2006.01)
(Continued)

(52) U.S. Cl.
CPC ............... *H02S 20/25* (2014.12); *E04D 1/26* (2013.01); *E04D 1/30* (2013.01); *F24J 2/0455* (2013.01);
(Continued)

(58) Field of Classification Search
CPC .... F24J 2/00; F24J 2/0422; F24J 2/045; F24J 2/0455; F24J 2002/0053; F24J 2002/0061;
(Continued)

(56) References Cited

U.S. PATENT DOCUMENTS

| | | | |
|---|---|---|---|
| 8,976,536 B2* | 3/2015 | French, Jr. | ........... H05K 7/1427 16/221 |
| 2008/0000512 A1* | 1/2008 | Flaherty | .................... E04D 1/30 136/244 |

(Continued)

FOREIGN PATENT DOCUMENTS

| CN | 101 105 069 A | 1/2008 |
|---|---|---|
| CN | 102137976 A | 7/2011 |

(Continued)

OTHER PUBLICATIONS

Supplementary European Search Report of corresponding EP application 14893776 dated Nov. 2, 2017.
English translation of International Preliminary Report on Patentability of PCT/JP2014/065044, dated Dec. 6, 2016, 10 pages.

*Primary Examiner* — Jessica L Laux
(74) *Attorney, Agent, or Firm* — Muncy, Geissler, Olds & Lowe, P.C.

(57) ABSTRACT

An object is to provide a technique capable of making the appearance of the entire roof on which a solar cell module is laid more beautiful.
In a solar cell module that includes a front side transparent plate, a rear face sealing plate made of glass, and a solar cell sealed between the front side transparent plate and the rear face sealing plate, the area of the rear face sealing plate is made larger than the light receiving area of the solar cell and the area of the front side transparent plate. That is, the glass plate that seals the rear side of the solar cell expands to the outer side with respect to the front side transparent plate located on the front face of the solar cell module. A surplus (Continued)

region in which neither the solar cell nor the front side transparent plate is present is formed on the front side of the rear face sealing plate.

16 Claims, 16 Drawing Sheets

(51) Int. Cl.
  *E04D 1/26* (2006.01)
  *H01L 31/048* (2014.01)
  *F24J 2/04* (2006.01)
  *E04D 1/00* (2006.01)

(52) U.S. Cl.
  CPC .... *H01L 31/0488* (2013.01); *E04D 2001/005* (2013.01)

(58) Field of Classification Search
  CPC .... E04D 1/30; E04D 1/26; E04D 1/04; E04D 2001/308; H02S 20/25; H02S 20/26; H01L 31/048
  See application file for complete search history.

(56) References Cited

U.S. PATENT DOCUMENTS

| | | | |
|---|---|---|---|
| 2010/0065107 A1* | 3/2010 | Nightingale | ............ H02S 20/25 136/251 |
| 2011/0162301 A1 | 7/2011 | Ueda et al. | |
| 2014/0090695 A1 | 4/2014 | Rodrigues | |
| 2016/0164453 A1* | 6/2016 | Cropper | .................. H02S 20/25 136/251 |
| 2017/0099029 A1* | 4/2017 | Reese | ..................... H02S 20/25 |

FOREIGN PATENT DOCUMENTS

| | | |
|---|---|---|
| EP | 2180525 A2 | 4/2010 |
| JP | 58-58356 A | 4/1983 |
| JP | H05-25890 A | 2/1993 |
| JP | 7-26664 A | 1/1995 |
| JP | 2006-328887 A | 12/2006 |
| JP | 2009-299450 A | 12/2009 |
| JP | 2010-065522 A | 3/2010 |
| WO | 2010030246 A2 | 3/2010 |

* cited by examiner

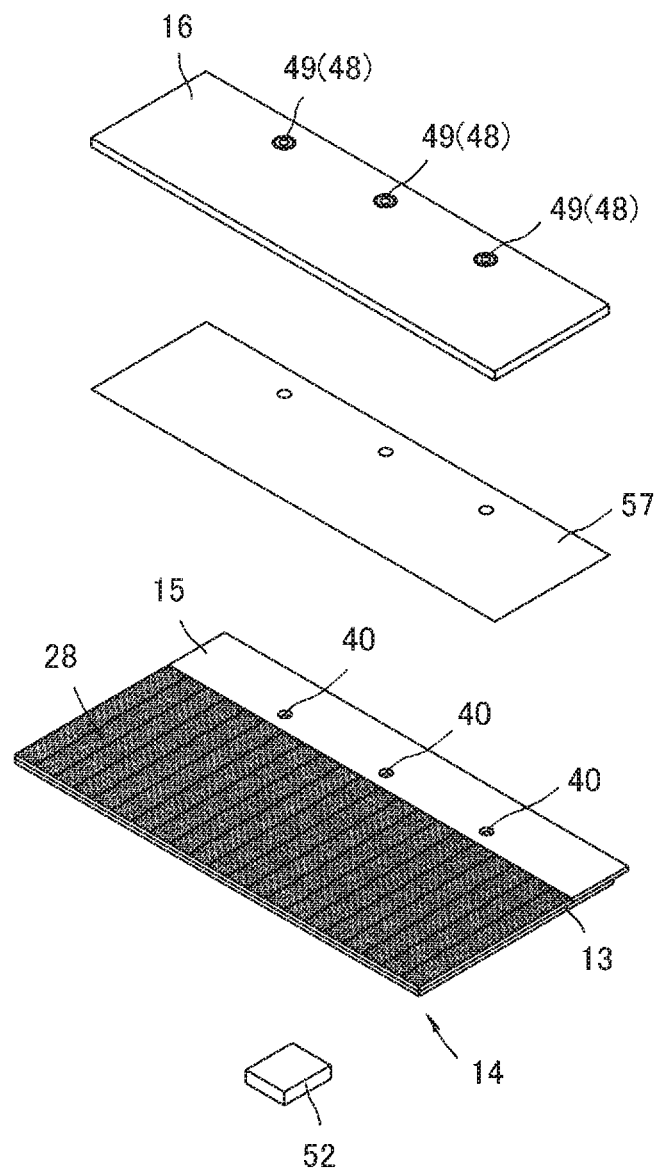

SOLAR CELL MODULE AND ROOF STRUCTURE

TECHNICAL FIELD

The present invention relates to a solar cell module, and more particularly, to a solar cell module that is capable of creating a sense of unity with a roof member around the solar cell module when installed on a roof. Further, the present invention relates to a roof structure that is formed by laying such a solar cell module.

BACKGROUND ART

A photovoltaic power generation system that receives sunlight to generate power has become widespread, and the introduction of the photovoltaic power generation system in ordinary households has been underway. Such a photovoltaic power generation system typically generates power by a solar cell module which is disposed on a roof and supplies the generated power.

When a solar cell module is placed on a roof, the appearance of the roof changes, which disadvantageously changes the impression of a house. For example, when the color of a solar cell module and the color of a roof member around the solar cell module largely differ from each other in lightness and saturation when compared, the solar cell module looks conspicuous. Further, when a large gap is formed between a solar cell module and a roof member located under the solar cell module, the solar cell module looks as if it is floating, and the solar cell module thus looks conspicuous.

In these cases, a beautiful appearance having a sense of unity cannot be created on the entire roof. Thus, some people looking at the roof may feel that the appearance is ugly.

Thus, for example, a technique disclosed in Patent Document 1 is known as a technique for solving such a problem.

A solar cell module disclosed in Patent Document 1 is integrally fixed onto a roof bed by fixing a pipe-like attachment member on the roof bed and inserting an annular member disposed on the rear side of the solar cell module into the attachment member. That is, the solar cell module is arranged instead of a roof member such as a tile.

The ridge side part of each solar cell module includes a region for placing the eaves side part of the upper stage solar cell module. The solar cell modules are laid in a partially overlapping manner. That is, no gap is formed in a step part between the solar cell modules which are arranged side by side in a step-like form.

According to such a structure in which the solar cell modules are laid on the roof with no gap therebetween instead of the roof member, no gap is formed between each solar cell module and the roof member located under the solar cell module, and the appearance looks beautiful.

PRIOR ART DOCUMENT

Patent Document

Patent Document 1: JP 07-026664 A

DISCLOSURE OF INVENTION

Technical Problem

However, in the technique of Patent Document 1, although there is no problem when the solar cell modules are laid on the entire roof, the solar cell modules may look conspicuous when the roof members and the solar cell modules are present together on the roof. That is, as described above, a part in which the solar cell modules are laid on the roof may become conspicuous due to a difference in a tone of color between the roof member and the solar cell module.

In the technique of Patent Literature 1, the attachment member is located on the rear side of the solar cell module. Thus, the attachment member is located at a position that is difficult to see. That is, the attachment member is less conspicuous than in a structure in which an attachment metal fitting and a frame member are located at the edge part of the solar cell module. However, in the structure disclosed in Patent Document 1, a part of the attachment member may be exposed through a gap formed between the solar cell module and the roof bed at the eaves side end or the ridge side end. Normally, an eaves edge metal fitting or a flashing plate is attached to the eaves side end and the ridge side end to cover such a gap. However, in this case, there may be caused a new problem such that the eaves edge metal fitting itself or the flashing plate itself looks conspicuous on the roof.

That is, the technique disclosed in Patent Document 1 has some room for improvement in making the appearance of the roof beautiful.

Thus, in view of the above problems in the conventional technique, it is an object of the present invention to provide a solar cell module that is capable of creating a better sense of unity between the solar cell module and a roof member around the solar cell module and capable of making the appearance of the entire roof more beautiful.

Further, another object of the present invention is to provide a roof structure that is formed by laying such a solar cell module and has a beautiful appearance.

Solution to Problem

One aspect of the present invention to solve the above problems is a solar cell module including: a front side transparent plate; a rear face sealing plate made of glass; and a solar cell sealed between the front side transparent plate and the rear face sealing plate, wherein an area of the rear face sealing plate is larger than a light receiving area of the solar cell and an area of the front side transparent plate, and wherein a surplus region in which neither the solar cell nor the front side transparent plate is present is present on a front side of the rear face sealing plate.

In the solar cell module of this aspect, the area of the rear face sealing plate as a glass plate for sealing the rear side of the solar cell is larger than the light receiving area of the solar cell and the area of the front side transparent plate. That is, the size of the rear face sealing plate is made larger than a normal one to form the surplus region in which neither the solar cell nor the front side transparent plate is present on the front side of the rear face sealing plate.

When the surplus region is provided in this manner, the surplus region can be used as a region for directly striking a screw or a nail therein. That is, the solar cell module can be directly fixed onto the roof without using attachment members such as a frame and a fixing metal fitting. In other words, since no attachment member is required, it is possible to prevent an attachment member from being conspicuous on the roof and to provide a roof having a beautiful appearance.

Further, since it is not necessary to fix an attachment member onto the roof in this manner, an operation of attaching the solar cell module can be advantageously simplified.

Further, the surplus region of the rear face sealing plate in which neither the solar cell nor the front side transparent plate is present can be arranged at the lower side of the adjacent solar cell module and the roof member. With such a configuration, even when, for example, rainwater infiltrates into the lower side through a gap between the solar cell module or the roof member, the rainwater can be received in the surplus region of the rear face sealing plate located at the lower side thereof. That is, the occurrence of rain leaking can be more reliably prevented.

In this aspect, preferably the area of the rear face sealing plate is 1.1 times or more and 4 times or less, compared to the light receiving area of the solar cell and the area of the front side transparent plate, and an area of the surplus region is 10% or more and 300% or less, compared to the area of the front side transparent plate.

In this aspect, preferably, the solar cell module further includes a step forming plate having a light transmissive property, the step forming plate being placed on a front side of the front side transparent plate in such a manner that a part of the step forming plate overlaps with a region in which the front side transparent plate is present and the rest part of the step forming plate protrudes from the front side transparent plate.

According to this preferred aspect, the front side transparent plate located on the front side of the solar cell and the step forming plate having a light transmissive property overlap with each other, and a step is formed therebetween. That is, the step is formed on the upper side of the front side transparent plate as a lighting surface of the solar cell.

When the roof members are laid on the roof, a step is typically formed in an overlapping part between the roof members adjacent in the ridge direction.

That is, a step like the step formed in the overlapping part between the roof members is formed on the exposed part of the solar cell module so that a part in which the solar cell module is located and a part in which the roof member is located are difficult to visually distinguish when the solar cell modules and the roof members are present together. Accordingly, it is possible to provide a roof having a better sense of unity between the solar cell module and the roof member around the solar cell module.

Preferably, the solar cell module further includes an auxiliary plate having a smaller area than the area of the front side transparent plate, the auxiliary plate being arranged to be adjacent to the front side transparent plate and to overlap with a region in which the step forming plate is present.

This preferred aspect enables the posture of the step forming plate to be stabilized.

More preferably, the front side transparent plate and the auxiliary plate are present on the front side of the rear face sealing plate with at least a part of the auxiliary plate overlapping with an entire area of the surplus region.

In this preferred aspect, the auxiliary plate is disposed in the surplus region which is used for directly striking a screw or a nail therein. Thus, it is possible to improve the fixing strength when a screw or a nail is struck in.

More preferably, each of the auxiliary plate and the rear face sealing plate includes a through hole, both of the through holes communicating with each other to form a communicating hole, and the solar cell module is fixable to an external member by inserting a fastening element into the communicating hole.

In this preferred aspect, the auxiliary plate is disposed in a part into which a fastening element is inserted. Thus, the fixing strength can be improved.

Preferably, the front side transparent plate is a glass plate, a front face of the front side transparent plate including: a roughened part that is roughened; the roughened part being planarly distributed; and a smooth part that keeps smoothness, the smooth part linearly extending vertically and/or horizontally, and the roughened part is divided into a plurality of quadrangular shapes by the smooth part.

According to this preferred aspect, the texture of the surface of the front side transparent plate located on the upper side of the solar cell can be made like the texture of the surface of the roof member. That is, the surface of the front side transparent plate and the surface of the roof member can be made extremely similar to each other in color and surface roughness.

Accordingly, when the solar cell module and the roof member are present together, a part in which the solar cell module is located and a part in which the roof member is located can be made difficult to visually distinguish. Thus, the sense of unity on the entire roof can be improved.

Another aspect of the present invention is a roof structure including a plurality of the above solar cell modules, the solar cell modules being laid on a top face of a building, wherein a region corresponding to the front side transparent plate of one of the solar cell modules is placed on the surplus region of another one of the solar cell modules in an overlapping manner.

Also in this preferred aspect, it is possible to provide a roof having a beautiful appearance in which no attachment member is conspicuous and to more reliably prevent the occurrence of rain leaking.

In this aspect, preferably, a roof member having a water proofing property and a certain shape, and the solar cell module are used together, and the roof structure includes a region in which the roof member is laid and the solar cell module is not laid, and a region in which the solar cell module is laid and the roof member is not laid.

Another aspect of the present invention is a solar cell modules including: a front side transparent plate made of glass; and a solar cell sealed on a rear face of the front side transparent plate, wherein a front face of the front side transparent plate includes: a roughened part that is roughened, the roughened part being planarly distributed; and a smooth part that keeps smoothness, the smooth part linearly extending vertically and/or horizontally, and wherein the roughened part is divided into a plurality of quadrangular shapes by the smooth part.

Another aspect of the present invention is a roof structure including: a plurality of roof members each having a water proofing property and a certain shape; and the above solar cell module, the roof members and the solar cell module being used together, wherein the roof structure includes: a roof member laid region in which the roof members are laid and the solar cell module is not laid; and a module laid region in which the solar cell module is laid and the roof members are not laid, wherein the roof members are laid in the roof member laid region in such a manner that a part of one of the roof members is overlapped with another one of the roof members and the rest part of the one of the roof member is exposed, and wherein each of the divided quadrangular parts of the solar cell module has the same shape as the exposed part of the the roof members in the roof member laid region.

Also in theses aspects, when the solar cell module and the roof member are present together, a part in which the solar cell module is located and a part in which the roof member is located can be made difficult to visually distinguish. Thus, the sense of unity on the entire roof can be improved.

Another aspect of the present invention is a solar cell module including: a front side transparent plate; a rear face sealing plate; a solar cell sealed between the front side transparent plate and the rear face sealing plate; and a step forming plate having a light transmissive property, wherein an area of the rear face sealing plate is larger than a light receiving area of the solar cell and an area of the front side transparent plate, wherein an area of the step forming plate is smaller than the area of the front side transparent plate, and wherein the step forming plate is placed on a front side of the front side transparent plate in such a manner that a part of the step forming plate overlaps with a region in which the front side transparent plate is present and the rest part of the step forming plate protrudes from the front side transparent plate.

Preferably, both the front side transparent plate and the step forming plate have a quadrangular shape, and an area of an overlapping part between the step forming plate and the front side transparent plate is approximately an integral division of the area of the front side transparent plate.

Another aspect of the present invention is a roof structure including a plurality of the above solar cell modules, the solar cell modules being laid on a top face of a building, wherein a region corresponding to the front side transparent plate of one of the solar cell modules is placed on the step forming plate of another one of the solar cell modules in a shifted manner.

In this aspect, preferably, the roof structure includes a region in which a roof member having a water proofing property and a certain shape is laid and the solar cell module is not laid; and a region in which the solar cell module is laid and the roof member is not laid.

Also in these aspect, since a step like the step formed in the overlapping part between the roof members is formed on the exposed part of the solar cell module, a part in which the solar cell module is located and a part in which the roof member is located can be made difficult to visually distinguish when the solar cell modules and the roof members are present together. Accordingly, it is possible to provide a roof having a better sense of unity between the solar cell module and the roof member around the solar cell module.

Another aspect of the present invention is a solar cell module including: a front side transparent plate; a rear face sealing plate; a solar cell sealed between the front side transparent plate and the rear face sealing plate; and an auxiliary plate, wherein an area of the rear face sealing plate is larger than a light receiving area of the solar cell and an area of the front side transparent plate, wherein an area of the auxiliary plate is smaller than the area of the front side transparent plate, the auxiliary plate being placed in a region adjacent to the front side transparent plate, wherein the front side transparent plate and the auxiliary plate are present on the front side of the rear face sealing plate, each of the auxiliary plate and the rear face sealing plate having a through hole, both of the through holes communicating with each other to form a communicating hole, and wherein the solar cell module is fixable to an external member by inserting a fastening element into the communicating hole.

In this aspect, the auxiliary plate is disposed on the front side of the rear face sealing plate to form an overlapping part therebetween. Accordingly, the overlapping part can be used as a part for directly striking a screw or a nail therein. That is, also in this aspect, the solar cell module can be directly fixed onto the roof without using attachment members such as a frame and a fixing metal fitting. As a result, it is possible to prevent an attachment member from being conspicuous on the roof and to provide a roof having a beautiful appearance.

Further, in this aspect, through holes are formed on the auxiliary plate and the rear face sealing plate, the through holes communicating with each other to form a communicating hole, and a fastening element is inserted into the communicating hole to fix the solar cell module. That is, the auxiliary plate is located in a part in which the communicating hole for inserting the fastening element is present. Accordingly, the fixing strength can be improved.

In this aspect, preferably, the solar cell module further includes a step forming plate having a light transmissive property, a part of the step forming plate overlapping with the front side transparent plate, wherein the auxiliary plate is placed in a region in which the step forming plate is present in an overlapping manner.

In this aspect, the step forming plate which overlaps with the front side transparent plate located on the front side of the solar cell is provided. Accordingly, a step like the step formed in the overlapping part between the roof members can be formed on the exposed part of the solar cell module. Thus, a part in which the solar cell module is located and a part in which the roof member is located can be made difficult to visually distinguish when the solar cell modules and the roof members are present together. That is, the sense of unity on the entire roof can be improved.

Further, the posture of the step forming plate can be stabilized by disposing the auxiliary plate at the position overlapping with the step forming plate. That is, the strength of the solar cell module can be improved.

In this aspect, preferably, a buffer member is disposed inside the communicating hole.

According to this aspect, it is possible to prevent contact between the fastening element and the inner peripheral surface of the communicating hole when the fastening element is inserted into the communicating hole. Thus, damages of the inner peripheral surface of the communicating hole can be prevented.

In this aspect, preferably, the solar cell module further includes: a plurality of the communicating holes formed in a row; and a terminal box, wherein the terminal box protrudes from the rear face sealing plate, and wherein a position of the terminal box is separated by a certain distance toward the front side transparent plate from a region in which the communicating holes are formed in a row.

This aspect prevents the terminal box from being erroneously damaged when the fastening element is inserted into the communicating hole. Thus, this aspect is preferred.

Another aspect of the present invention is a roof structure including the above solar cell module, the solar cell module being laid on a top face of a building, wherein a plurality of crosspieces are disposed parallel to each other on the top face of the building, the solar cell module being placed on the crosspieces, wherein a fastening element protrudes from the communicating hole and is joined to the corresponding crosspiece to fix the solar cell module to the crosspiece, and wherein the terminal box is arranged in a gap between the crosspieces parallel to each other.

According to this aspect, when the solar cell module is disposed on the crosspieces, the terminal box is housed within a space formed between the crosspieces. Accordingly, it is possible to reduce the height of the surface in the entire solar cell module. That is, it is possible to make the surface of the solar cell module lower than that in the structure in which the terminal box is located on the upper side of the crosspiece. Thus, it is possible to provide a roof having a beautiful appearance without giving a thick impression to a viewer.

Effect of Invention

The present invention makes it possible to create a better sense of unity between the solar cell module and the roof member around the solar cell module and to make the appearance of the entire roof more beautiful.

BRIEF DESCRIPTION OF DRAWINGS

FIGS. 5A and 5B are diagrams illustrating a bushing member of FIG. 4, wherein FIG. 5A is a font view and FIG. 5B is a sectional view.

FIG. 8 is an explanatory diagram illustrating the assembly procedure of the solar cell module and illustrating a state in which a terminal box is attached and an EVA sheet and a decorative glass are laminated following FIG. 7.

FIGS. 9A and 9B are sectional views illustrating the bushing member and the surroundings thereof when the EVA sheet and the decorative glass are laminated, wherein FIG. 9A illustrates a state before the lamination of the EVA sheet and the decorative glass and FIG. 9B illustrates a state after the lamination of the EVA sheet and the decorative glass.

FIGS. 16A and 16B are sectional views illustrating the bushing member and the surroundings thereof when the solar cell module is fixed to a purlin member, wherein FIG. 16A illustrates a state before the insertion of a fastening element and FIG. 16B illustrates a state after the insertion of the fastening element.

BEST MODE FOR CARRYING OUT THE INVENTION

Hereinbelow, a roof structure 1 according to a first embodiment of the present invention will be described in detail with reference to the drawings. In the following description, a front-back direction, an up-down direction, and a right-left direction are described based on a normal installation state illustrated in FIG. 1 unless otherwise specifically noted.

Figure 1:
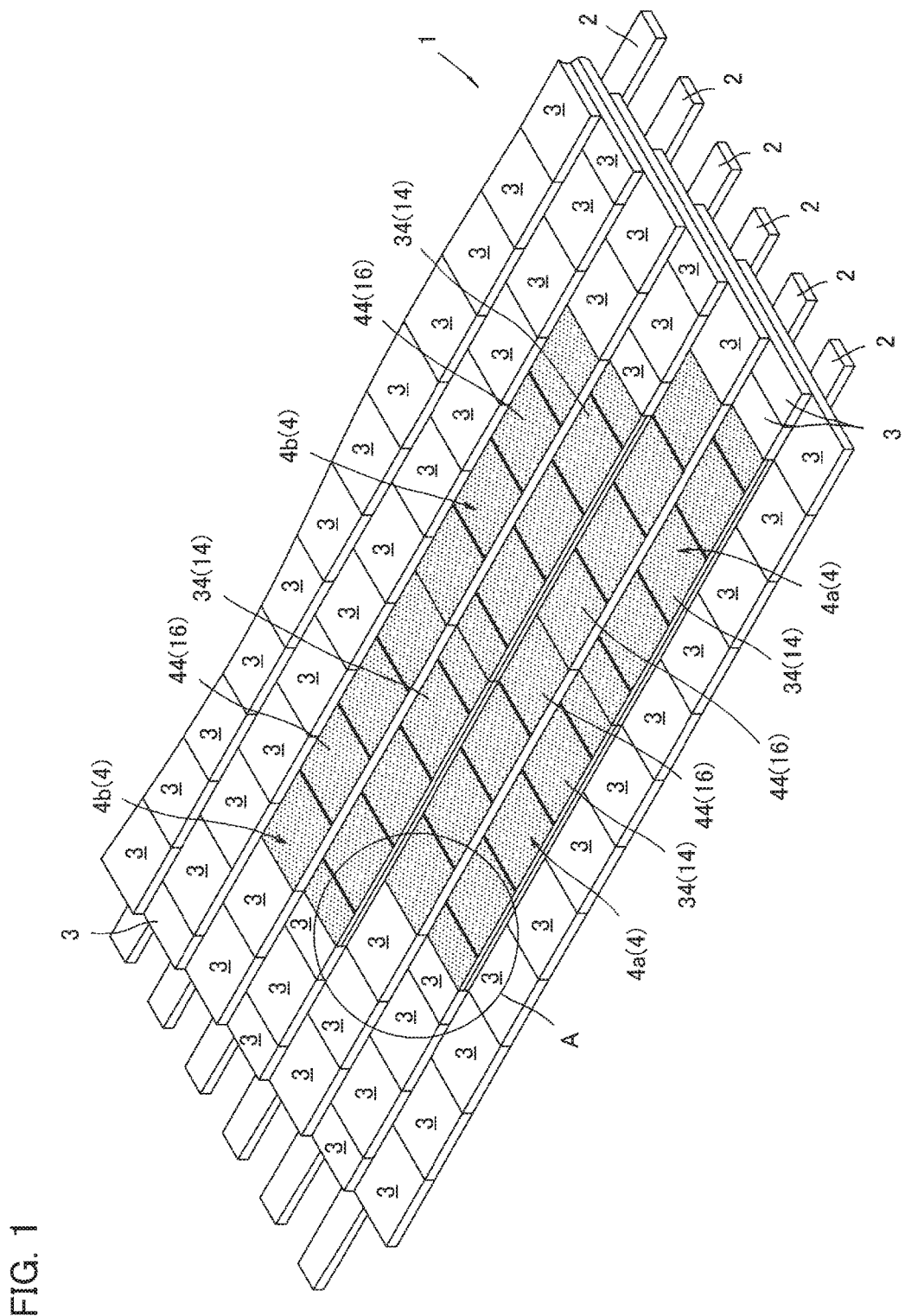
FIG. 1 is a perspective view illustrating a roof structure according to a first embodiment of the present invention.

As illustrated in FIG. 1, the roof structure 1 of the present embodiment is formed by fixing a slate tile 3 (roof member) and a solar cell module 4 to a plurality of purlin members 2 (crosspieces, outer members) which are arranged side by side at predetermined intervals in a ridge direction (a direction from the eaves edge toward the ridge side).

Each of the purlin members 2 is a wooden member having a prism shape and extends in a span direction (a direction perpendicular to the ridge direction). Each of the purlin members 2 arranged parallelly at predetermined intervals is parallel to a ridge pole and a pole plate (not illustrated). That is, the plurality of purlin members 2 are attached to a roof part (top face) of a building and arranged side by side parallel to each other.

Figure 2:
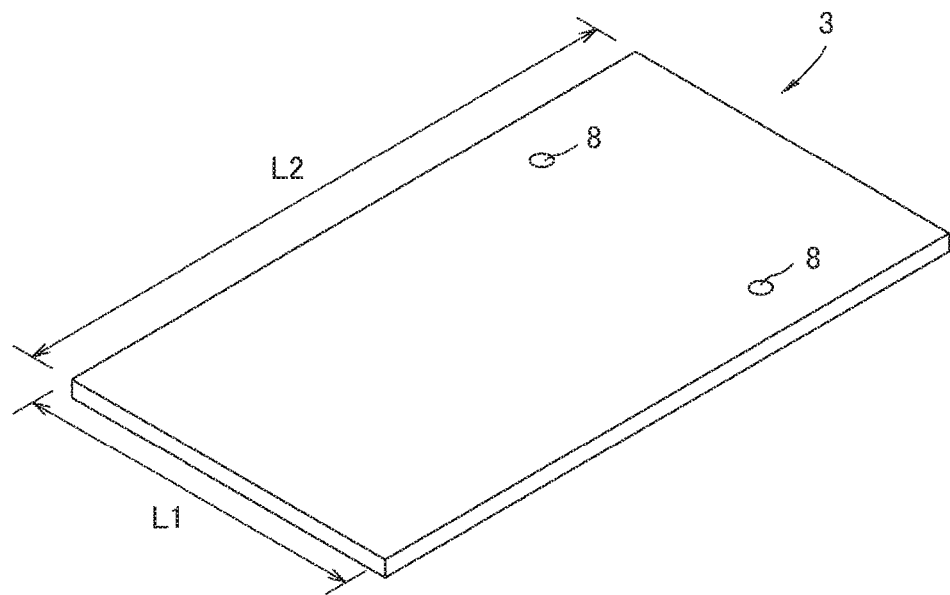
FIG. 2 is a perspective view illustrating a slate tile of FIG. 1.

The slate tile 3 is a substantially rectangular plate-like member which is formed by shaping a cut-out natural rock or artificially composed in an identical shape. As illustrated in FIG. 2, in the slate tile 3, a ridge direction length L2 is longer than a width L1. More specifically, the width L1 is approximately 250 mm, the ridge direction length L2 is approximately 500 mm, and a thickness is approximately 4 mm. Thus, the ridge direction length L2 is approximately twice the width L1.

The slate tile 3 includes an attachment hole 8 which penetrates the slate tile 3 itself in the thickness direction. The attachment hole 8 is formed in a part that is located at the ridge side with respect to the center in the ridge direction and located at a position slightly off to the center from an end in the width direction (span direction). In the present embodiment, the slate tile 3 includes two attachment holes 8 in total each of which is formed on each end in the width direction thereof. The two attachment holes 8 are arranged parallelly an interval in the width direction. In other words, in the slate tile 3 of the present embodiment, a plurality of attachment holes 8 are arranged parallelly in the width direction.

Figure 3:
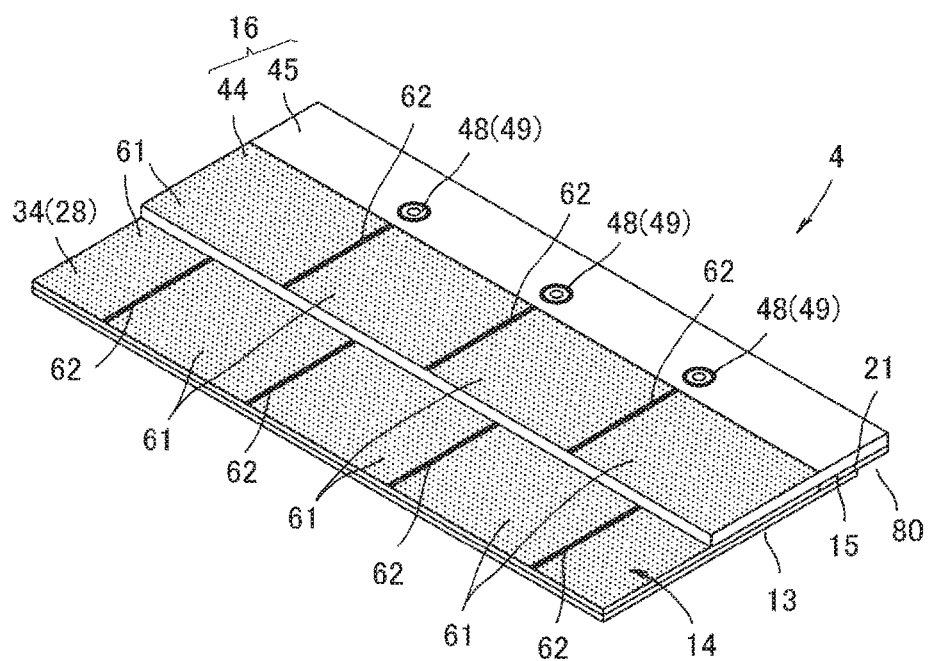
FIG. 3 is a perspective view illustrating a solar cell module of FIG. 1.
Figure 4:
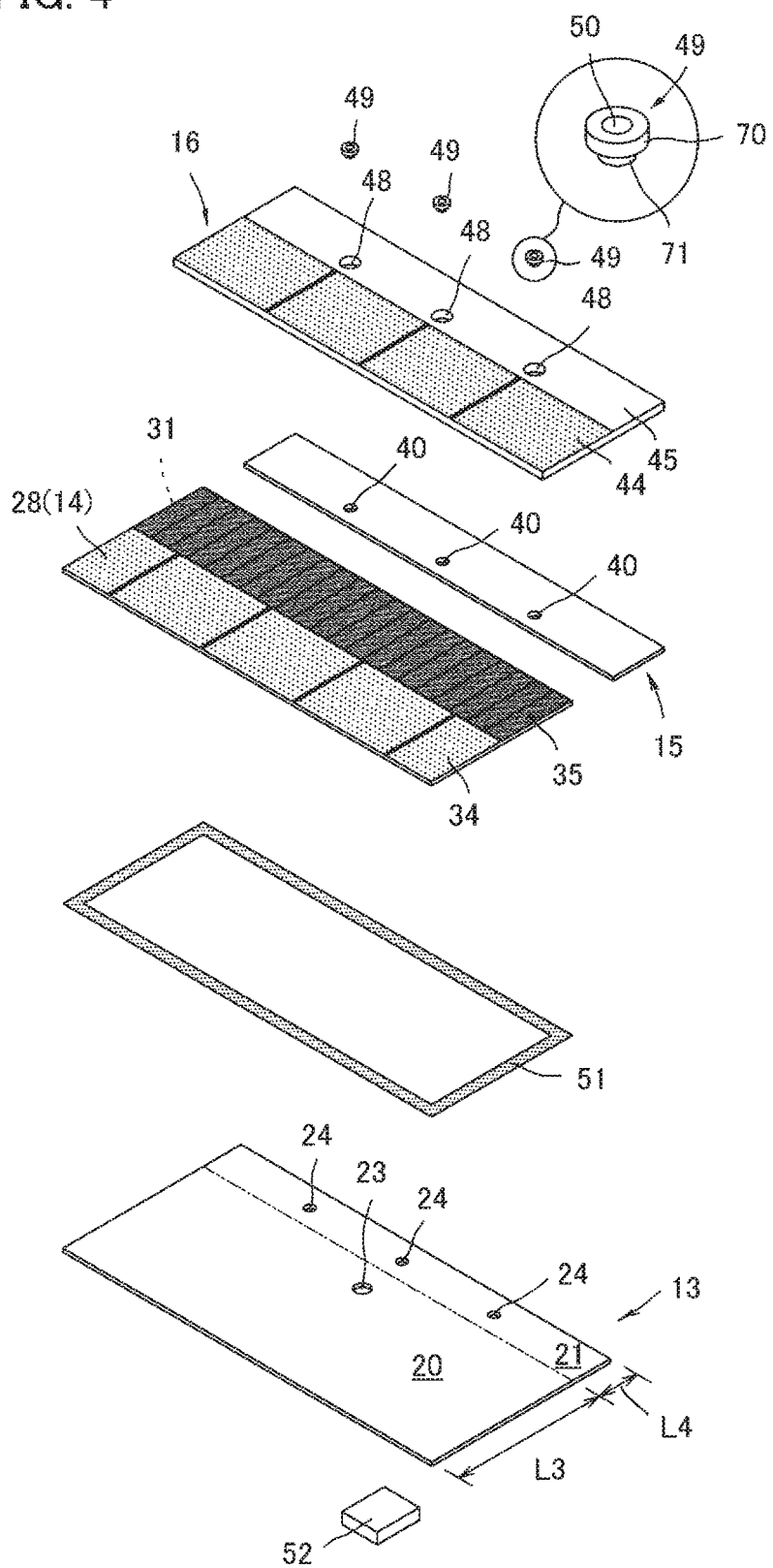
FIG. 4 is an exploded perspective view illustrating the solar cell module of FIG. 3 in which an EVA sheet is omitted.

As illustrated in FIGS. 3 and 4, the solar cell module 4 is provided with a back glass 13 (rear face sealing plate), a solar cell section 14 which is formed by sealing the rear side with the back glass 13, and a position adjusting glass 15 (auxiliary plate). Further, a decorative glass 16 (step forming plate) is fixed to the upper side of the solar cell section 14 and the position adjusting glass 15 to form the solar cell module 4.

The back glass 13 is a glass member which has a substantially rectangular plate-like outer shape and functions as a sealing member which seals the rear side of the solar cell section 14. As illustrated in FIG. 4, the most part of the front face of the back glass 13 located at the eaves side serves as a solar cell sealing region 20 for sealing the solar cell section 14 from the rear side thereof.

More specifically, the back glass 13 is divided into the solar cell sealing region 20 which is located at the eaves side and an outer region 21 (surplus region) which is located at the ridge side.

The solar cell sealing region 20 is a part that occupies the most part of the front face of the back glass 13 and extends from the eaves side end up to a position slightly off to the center in the ridge direction from the ridge side end. More specifically, the entire width direction area (the entire span direction area) of the part corresponds to the solar cell sealing region 20. In other words, the length in the width direction (span direction) of the back glass 13 is equal to the length in the width direction (span direction) of the solar cell sealing region 20.

The outer region 21 is a part of the front face of the back glass 13 that extends from the ridge side end of the solar cell sealing region 20 up to the ridge side end of the back glass 13. More specifically, the entire width direction area (the entire span direction area) of the part corresponds to the outer region 21. In other words, the length in the width direction (span direction) of the back glass 13 is equal to the length in the width direction (span direction) of the outer region 21.

A ridge direction length L3 of the solar cell sealing region 20 is longer than a ridge direction length L4 of the outer region 21. More specifically, the ridge direction length L3 of the solar cell sealing region 20 is approximately 86% of a ridge direction length (L3+L4) of the back glass 13. The area of the outer region 21 is approximately 17% of the area of the solar cell sealing region 20.

The solar cell sealing region 20 includes a lead insertion hole 23. The outer region 21 includes a fastening element insertion hole 24 (through hole). Both the lead insertion hole 23 and the fastening element insertion hole 24 are through holes that penetrate the back glass 13 in the thickness direction.

The lead insertion hole 23 is a hole for inserting a cable (not illustrated) which extends to the outside from the solar cell section 14. The lead insertion hole 23 is formed at a slightly lower side with respect to the ridge side end of the solar cell sealing region 20 near the center in the width direction thereof.

The fastening element insertion hole 24 is a hole for inserting a fastening element (described in detail below) and formed at a slightly ridge side with respect to the eaves side end of the outer region 21. More specifically, the outer region 21 includes three fastening element insertion holes 24 which are formed at the same position in the ridge direction. The three fastening element insertion holes 24 are arranged side by side at predetermined intervals in the width direction. One of the three fastening element insertion holes 24 is formed on the center (or near the center) in the width direction of the back glass 13. The other two fastening element insertion holes 24 are formed at a position that is slightly separated toward the center from one side end in the width direction of the back glass 13 and a position that is slightly separated toward the center from the other side end in the width direction. All the fastening element insertion holes 24 are through holes having a circular opening shape.

In the solar cell section 14, a conductive film and a semiconductor film are laminated on the rear side of a cover glass 28 (front side transparent plate) which is located on the uppermost side when installed, and the laminated body is divided to form a plurality of solar cells 31. The solar cells 31 are electrically connected in series. The cover glass 28 on which the solar cells 31 are formed is further sealed, on the rear side thereof, with the solar cell sealing region 20 which is a part of the back glass 13. The solar cell section 14 is connected to a terminal box 52 (described below) and capable of extracting generated power to the outside.

That is, in the solar cell section 14, the front face (upper face) of the cover glass 28 serves as a light receiving surface, and light transmitted through the cover glass 28 reaches the solar cells 31 to generate power. The cover glass 28 is a substantially rectangular plate-like member having a substantially quadrangular shape in plan view.

The length in the width direction (span direction) of the solar cell section 14 and the cover glass 28 is equal to the length in the width direction (span direction) of the back glass 13. The front face of the cover glass 28 is divided into an exposed region 34 which is located at the eaves side and a transmitted light receiving region 35 which is located at the ridge side.

The exposed region 34 is a part of the front face of the cover glass 28 that extends from the eaves side end up to a position near the center in the ridge direction. More specifically, the entire width direction area (the entire span direction area) of the part corresponds to the exposed region 34. In other words, the length in the width direction (span direction) of the cover glass 28 is equal to the length in the width direction (span direction) of the exposed region 34.

The exposed region 34 is surface-treated, so that the appearance of the exposed region 34 is extremely similar to the appearance of the slate tile 3. The surface treatment will be described in detail below.

The transmitted light receiving region 35 is a part of the front face of the cover glass 28 that extends from the ridge side end of the exposed region 34 up to the ridge side end of the cover glass 28. More specifically, the entire width direction area (the entire span direction area) of the part corresponds to the transmitted light receiving region 35. In other words, the length in the width direction (span direction) of the cover glass 28 is equal to the length in the width direction (span direction) of the transmitted light receiving region 35.

The position adjusting glass 15 is disposed at a position adjacent to the solar cell section 14. The position adjusting glass 15 is a glass member having a substantially rectangular plate-like outer shape. That is, the position adjusting glass 15 is a light-transmissive member. The length in the width direction (span direction) of the position adjusting glass 15 is equal to the length in the width direction (span direction) of the back glass 13.

The position adjusting glass 15 includes a fastening element insertion hole 40 (through hole). The fastening element insertion hole 40 is a through hole which has a circular opening shape and penetrates the position adjusting glass 15 in the thickness direction. More specifically, the position adjusting glass 15 includes three fastening element insertion holes 40 which are formed at the same position in the ridge direction and arranged side by side at predetermined intervals in the width direction. One of the three fastening element insertion holes 40 is formed on the center (or near the center) in the width direction of the position adjusting glass 15. The other two fastening element insertion holes 40 are formed at a position that is off to one side end from the center in the width direction and a position that is off to the other side end from the center in the width direction.

The decorative glass 16 is a glass member which has a substantially rectangular plate-like outer shape and has a substantially quadrangular shape in plan view. The front face of the decorative glass 16 is divided into an eaves side region 44 and a ridge side region 45. The length in the width direction (span direction) of the decorative glass 16 is equal to the length in the width direction (span direction) of the back glass 13.

The eaves side region 44 is a part that is located on the upper side of the transmitted light receiving region 35 in the solar cell section 14 when assembled. The eaves side region 44 is also surface-treated, so that the appearance thereof is extremely similar to the appearance of the slate tile 3. The surface treatment will also be described in detail below.

The ridge side region 45 is a part that is located on the upper side of the position adjusting glass 15 when assembled and includes three bushing insertion holes 48. All the bushing insertion holes 48 are through holes that have a circular opening shape and penetrate the decorative glass 16 in the thickness direction. The three bushing insertion holes 48 are located at the same position in the ridge direction and arranged parallelly at predetermined intervals in the width direction. One of the bushing insertion holes 48 is formed on the center (or near the center) in the width direction of the decorative glass 16. The other two bushing insertion holes 48 are formed at a position that is off to one side end from the center in the width direction and a position that is off to the other side end from the center in the width direction.

As illustrated in FIG. 3, the solar cell module 4 is formed by fitting bushing members 49 (buffer members) into the respective bushing insertion holes 48.

Figure 5A:
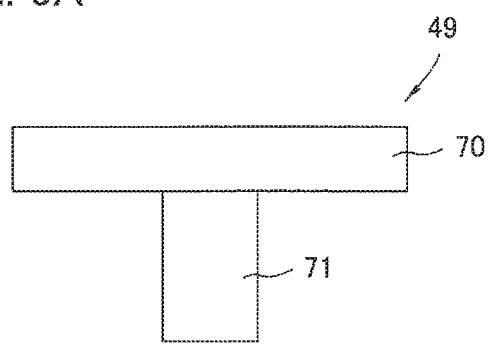
Figure 5B:
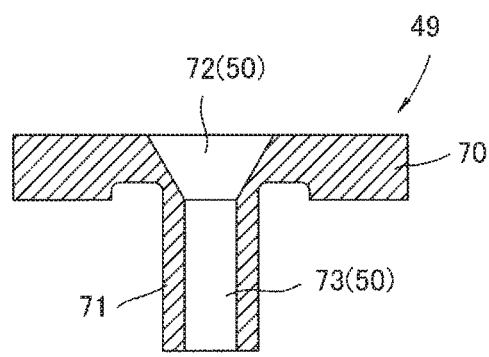

Each of the bushing members 49 is made of a plastic material. As illustrated in FIGS. 4 and 5, the bushing member 49 includes a flange part 70 which is located on the upper side and a cylindrical part 71 which is located on the lower side, the flange part 70 and the cylindrical part 71 being integrated together.

The flange part 70 has a substantially discoid outer shape and, as illustrated in FIG. 5, includes an upper through hole 72 which is formed on the central part of the flange part 70 and penetrates the flange part 70 in the thickness direction. The upper through hole 72 is a substantially conical through hole whose diameter is reduced toward the lower side, and the central axis of the upper through hole 72 is located on the center of the flange part 70 (the center of the bushing member 49).

The cylindrical part 71 protrudes downward from the lower face of the flange part 70 and includes a lower through hole 73 which is formed on the central part thereof. The central axis of the lower through hole 73 is located on the center of the cylindrical part 71 (the center of the bushing member 49). The lower through hole 73 extends in the longitudinal direction of the cylindrical part 71.

The upper through hole 72 of the flange part 70 and the lower through hole 73 of the cylindrical part 71 are continuous with each other in the up-down direction to form a fastening element insertion hole 50 which is an integrated through hole. The fastening element insertion hole 50 extends in the up-down direction and includes openings on the upper end face and the lower end face of the bushing member 49. That is, the fastening element insertion hole 50 is a through hole that penetrates the entire bushing member 49 in the thickness direction.

Next, an assembly structure of the solar cell module 4 will be described in detail with reference to the drawings.

Figure 6:
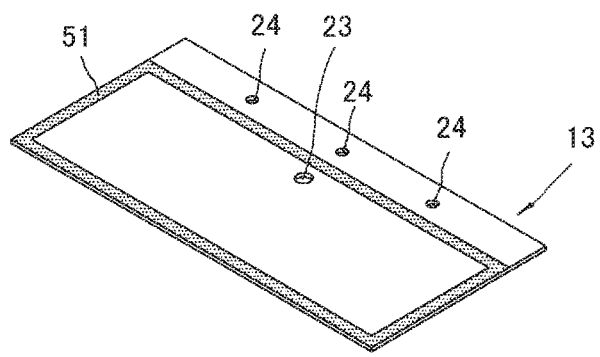
FIG. 6 is an explanatory diagram illustrating an assembly procedure of the solar cell module and illustrating a state in which a seal member is attached to a back glass.

As illustrated in FIG. 6, a seal member 51 which extends in a quadrangular annular shape (or a partially-lacked quadrangular annular shape) is fixed to the front side of the back glass 13.

The seal member 51 is formed of an appropriate material such as natural rubber, synthetic rubber, or synthetic resin and linearly extends. The seal member 51 includes a part that is located on the eaves side end and extends in the width direction, a part that is located on the width direction end and extends in the ridge direction, and a part that is located at a slightly ridge side with respect to the fastening element insertion holes 24 and extends in the width direction on the front face of the back glass 13. These parts are continuous with each other to form the seal member 51.

The seal member 51 extending along the edge part of the solar cell sealing region 20 is fixed to the back glass 13. Thus, the lead insertion hole 23 is located inside a part surrounded by the seal member 51, and the fastening element insertion holes 24 are located outside the part surrounded by the seal member 51.

Figure 7:
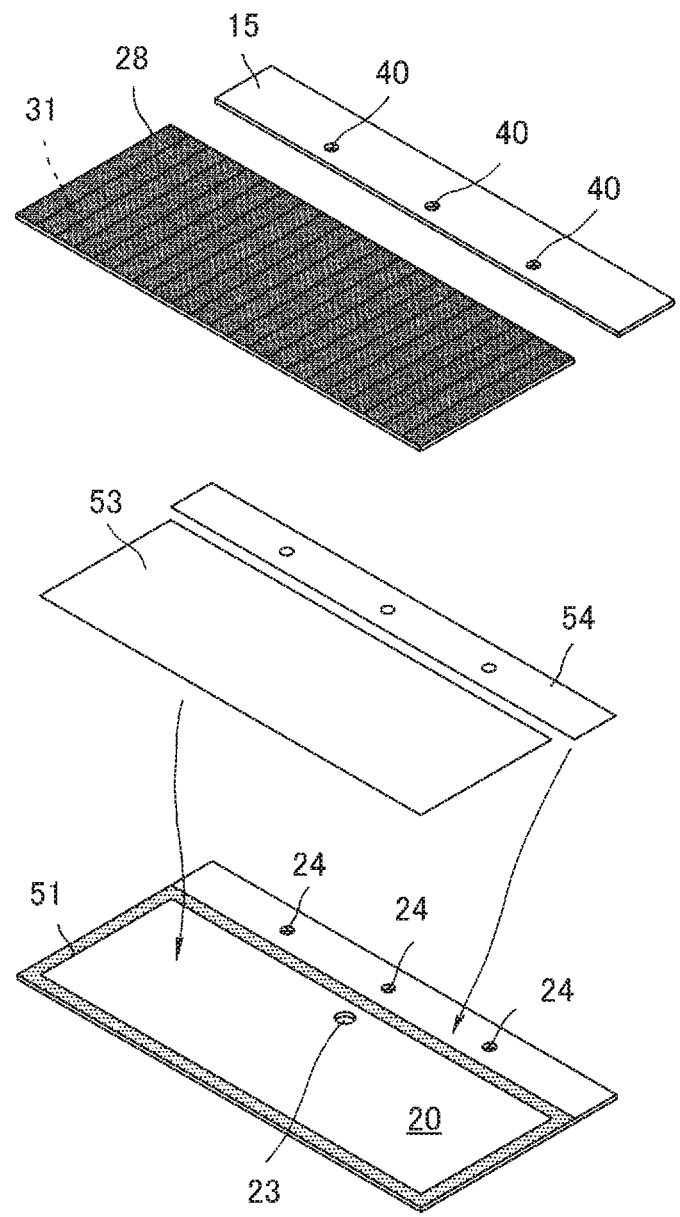
FIG. 7 is an explanatory diagram illustrating the assembly procedure of the solar cell module and illustrating a state in which an EVA sheet, a cover glass, and a position adjusting glass are laminated on the back glass of FIG. 6.

Then, as illustrated in FIGS. 7 and 8, the cover glass 28 and a part of the position adjusting glass 15 are placed on the upper side of the back glass 13 and integrally fixed thereto. Accordingly, the rear side of the cover glass 28 is sealed to form the solar cell section 14 (refer to FIG. 8).

More specifically, a cell EVA (ethylene-vinyl acetate) sheet 53 is laminated on the upper side of a part corresponding to the solar cell sealing region 20 in a region located inside the seal member 51. On the other hand, an adjusting glass EVA sheet 54 is laminated on the upper side of the outer region 21 in a region located outside the seal member 51. The cell EVA sheet 53 and the adjusting glass EVA sheet 54 are arranged side by side at an interval, and a part of the seal member 51 is arranged between the cell EVA sheet 53 and the adjusting glass EVA sheet 54.

The area of the lower face or the upper face of the position adjusting glass 15 is smaller than the area of the lower face or the upper face of the cover glass 28. Thus, the area of the adjusting glass EVA sheet 54 is also smaller than the area of the cell EVA sheet 53.

Then, the cover glass 28 is positioned on the upper side of the seal member 51 and the cell EVA sheet 53, and a part of the position adjusting glass 15 is positioned on the upper side of the adjusting glass EVA sheet 54. At this point, the cover glass 28 and the position adjusting glass 15 are adjacently arranged side by side with no gap therebetween. That is, a ridge side end face of the cover glass 28 and an eaves side end face of the position adjusting glass 15 are in contact with each other.

Thus, the seal member 51 is located under an edge part of the lower face of the cover glass 28. As a result, in a space formed between the cover glass 28 and the back glass 13, the edge part is sealed with the seal member 51, and the solar cell 31 laminated on the rear side of the cover glass 28 overlaps with the cell EVA sheet 53.

Specifically, in substantially the entire area of the overlapping part between the cover glass 28 and the back glass 13, a laminate body including the cover glass 28, the solar cell 31, the cell EVA sheet 53, and the back glass 13 which are laminated in this order from the front side is formed. In other words, the rear side of a laminate body including the cover glass 28 and the solar cell 31 is sealed with the cell EVA sheet 53 and the back glass 13 to form the solar cell section 14.

At this point, a lead (not illustrated) extending from the solar cell section 14 is inserted in the lead insertion hole 23 (refer to FIG. 7) and extends up to a part located outside the rear face of the back glass 13.

An eaves side part of the position adjusting glass 15 is located on the upper side of the back glass 13, and the other part thereof protrudes toward the ridge side from the back glass 13. More specifically, a part of the position adjusting glass 15 that is located between the eaves side end and a position slightly off to the ridge side from the ridge direction center overlaps with the back glass 13. Further, a ridge side part of the position adjusting glass 15 is located at the ridge side with respect to the ridge side end of the back glass 13.

Then, as illustrated in FIG. 8, a decorative glass EVA sheet 57 is placed on the upper side of the solar cell section 14 and the position adjusting glass 15, and the decorative glass 16 is further placed on the upper side thereof.

More specifically, the decorative glass EVA sheet 57 and the decorative glass 16 are placed on the upper side of the transmitted light receiving region 35 (refer to FIG. 4) which is located at the ridge side part of the solar cell section 14 and the position adjusting glass 15. Then, the terminal box 52 is fixed to the rear side of the back glass 13.

The area of the upper face of the decorative glass EVA sheet 57 and the area of the rear face of the decorative glass 16 are substantially equal to each other. The decorative glass 16 exactly overlaps with the upper side of the decorative glass EVA sheet 57. Thus, the decorative glass EVA sheet 57 is located on the lower side of substantially the entire part of the rear face of the decorative glass 16.

In the present embodiment, each of the bushing members 49 is previously disposed inside the corresponding bushing insertion hole 48 of the decorative glass 16, and, in this state, the decorative glass 16 is positioned on the upper side of the decorative glass EVA sheet 57. Accordingly, a part of the bushing member 49 is also placed on the upper side of the decorative glass EVA sheet 57, and the bushing member 49 is integrally fixed to the position adjusting glass 15 through the decorative glass EVA sheet 57.

Figure 9A:
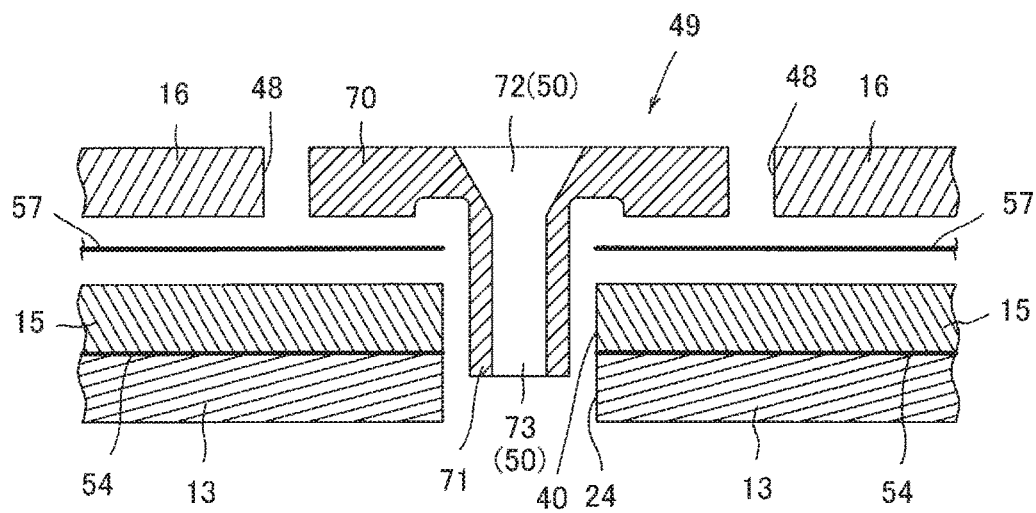

Specifically, as illustrated in FIGS. 8 and 9A, the bushing member 49 is first disposed inside the bushing insertion hole 48 of the decorative glass 16. Then, as illustrated in FIG. 9B, the decorative glass 16 and the bushing member 49 are placed on the decorative glass EVA sheet 57.

Figure 9B:
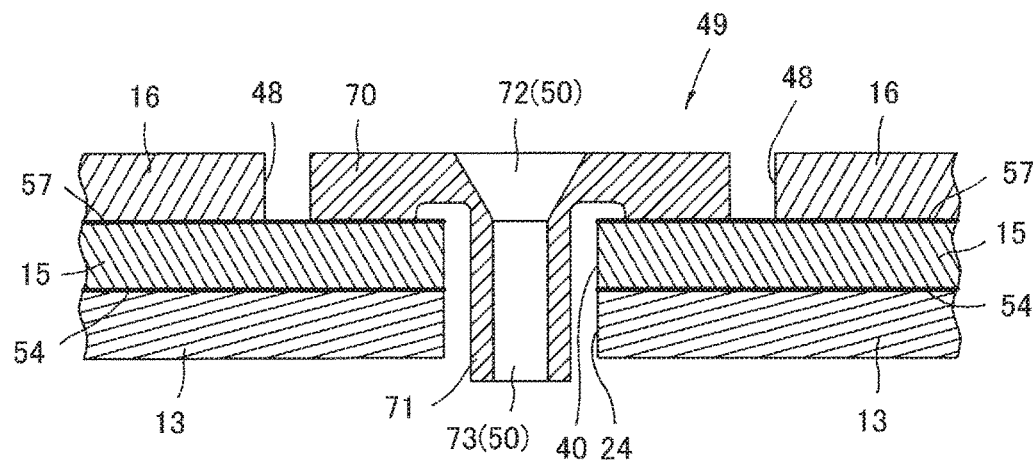

As illustrated in FIG. 9B, when the back glass 13, the position adjusting glass 15, and the decorative glass 16 are laminated, the fastening element insertion hole 24 of the back glass 13, the fastening element insertion hole 40 of the position adjusting glass 15, and the bushing insertion hole 48 of the decorative glass 16 are brought to overlap with each other.

The two fastening element insertion holes 24, 40 and the bushing insertion hole 48 overlap with each other with the central axes aligned. The two fastening element insertion holes 24, 40 and the bushing insertion hole 48 form a continuous communicating hole. The two fastening element insertion holes 24, 40 have the same hole diameter. The hole diameter of the bushing insertion hole 48 is larger than the hole diameter of the fastening element insertion holes 24, 40.

Thus, when the bushing member 49 is disposed inside the bushing insertion hole 48 and the decorative glass 16 is placed on the upper side of the decorative glass EVA sheet 57, the flange part 70 of the bushing member 49 is located inside the bushing insertion hole 48 as illustrated in FIG. 9B. Further, the cylindrical part 71 of the bushing member 49 is located inside a communicating hole formed by the two fastening element insertion holes 24, 40. Further, the fastening element insertion hole 50 formed in the bushing member 49 is located inside the continuous communicating hole formed by the two fastening element insertion holes 24, 40 and the bushing insertion hole 48.

The most part of the lower face of the flange part 70 which is located inside the bushing insertion hole 48 is placed on the upper side of the position adjusting glass 15 and is in intimate contact with the upper face of the decorative glass EVA sheet 57. That is, the decorative glass EVA sheet 57 is interposed between the decorative glass 16 and the position adjusting glass 15 and between the flange part 70 and the position adjusting glass 15. Then, the decorative glass 16 and the flange part 70 are integrally fixed to the position adjusting glass 15 by adhesive force of the decorative glass EVA sheet 57.

In this manner, the bushing member 49 is disposed inside the bushing insertion hole 48 and the decorative glass 16 is placed on the upper side of the decorative glass EVA sheet 57 to integrally fix the decorative glass 16 and the flange part 70 to the position adjusting glass 15. That is, in the present embodiment, the bushing member 49 is fixed simultaneously with the lamination of the decorative glass 16 on the decorative glass EVA sheet 57.

In other words, when the decorative glass 16 is placed on the upper side of the position adjusting glass 15, the rear side of the decorative glass 16 is laminated with the decorative glass EVA sheet 57. That is, the rear side of the decorative glass 16 is laminated with the bushing member 49 disposed inside the bushing insertion hole 48 to integrally fix the bushing member 49 to the position adjusting glass 15.

In the bushing member 49, the diameter of the flange part 70 is sufficiently smaller than the inner diameter of the bushing insertion hole 48, and the diameter of the cylindrical part 71 is sufficiently smaller than the inner diameter of the two fastening element insertion holes 24, 40. Thus, when the bushing member 49 is disposed inside the continuous communicating hole which is formed by the bushing insertion hole 48 and the two fastening element insertion holes 24, 40, a gap is formed between the inner peripheral surface of the communicating hole and the bushing member 49. This prevents the bushing member 49 from damaging the inner peripheral surface of the communicating hole when the bushing member 49 is inserted into the communicating hole.

More specifically, for example, the bushing member may be slightly larger than the communicating hole and pushed into the communicating hole while being flexibly deformed. In this case, when the bushing member is pushed in, the inner peripheral surface of the communicating hole may be damaged by the application of force with the bushing member making contact with the inner peripheral surface of the communicating hole. On the other hand, in the present embodiment, the bushing member 49 is sufficiently smaller than the communicating hole so that the bushing member 49 is less likely to make contact with the inner peripheral surface of the communicating hole during the insertion of the bushing member 49. This prevents the bushing member 49 from damaging the inner peripheral surface of the communicating hole and from damaging the back glass 13, the position adjusting glass 15, and the decorative glass 16.

When the bushing member 49 is in a fixed state, as illustrated in FIG. 9B, the lower end of the bushing member 49 is located below the lower face of the back glass 13. More specifically, the length of the cylindrical part 71 (the axial length of the bushing member 49) is longer than the total thickness of the back glass 13, the adjusting glass EVA sheet 54, the position adjusting glass 15, and the decorative glass EVA sheet 57. The lower end part of the cylindrical part 71 protrudes downward from the lower end opening of the communicating hole which is formed by the bushing insertion hole 48 and the two fastening element insertion holes 24, 40. This enables damages of the back glass 13 to be prevented and enables the posture of the solar cell module 4 to be stabilized when the solar cell module 4 is fixed to the purlin member 2 (described in detail below).

Figure 10:
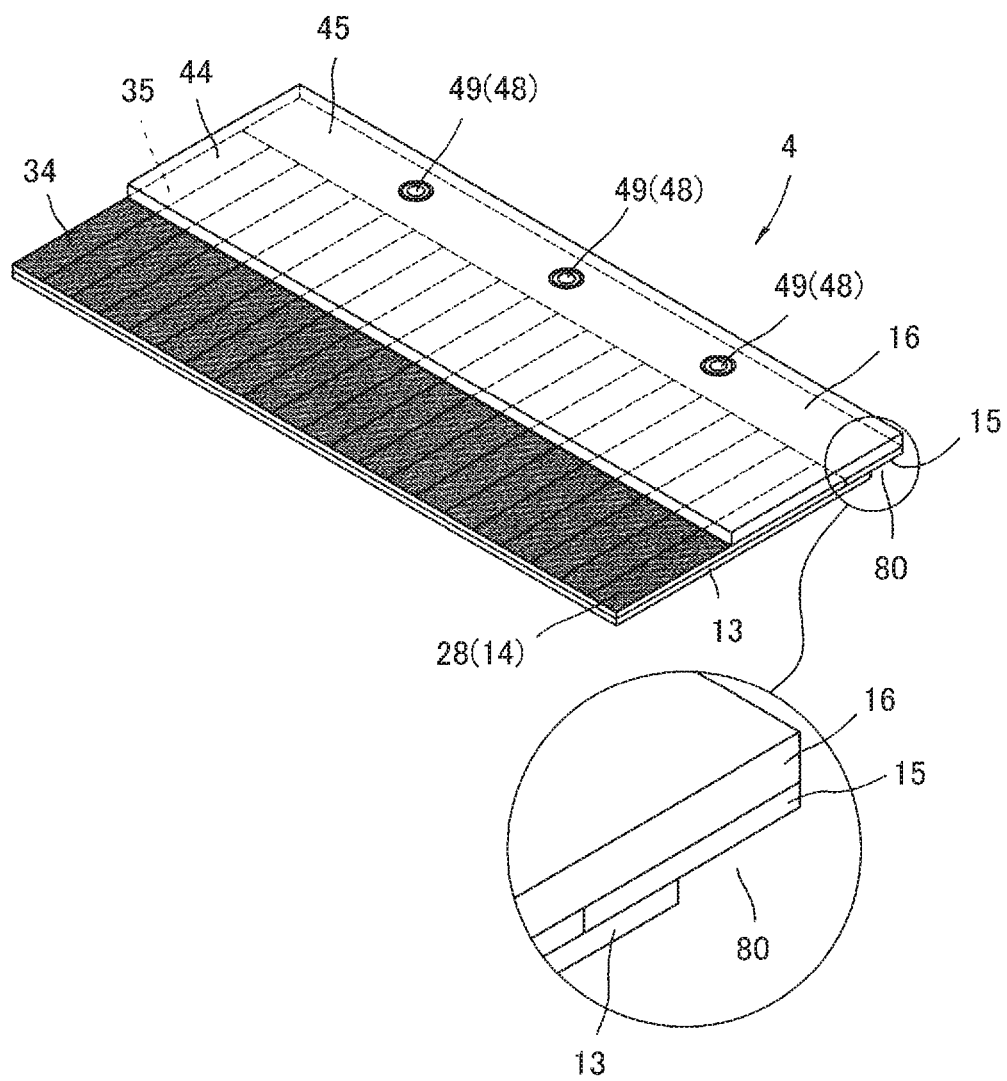
FIG. 10 is an explanatory diagram illustrating the assembly procedure of the solar cell module and illustrating a state in which the cover glass and the position adjusting glass have been laminated on the back glass, and the decorative glass has been further laminated thereon.

Accordingly, as illustrated in FIG. 10, the back glass 13, the position adjusting glass 15, the decorative glass 16, and the cover glass 28 are integrally fixed. Further, the solar cell section 14 is formed in an overlapping part extending from the cover glass 28 through the back glass 13, and the eaves side region 44 of the decorative glass 16 overlaps with the upper side of the transmitted light receiving region 35 which is located at the ridge side of the solar cell section 14.

That is, the decorative glass 16 is located at the front side of the cover glass 28. The eaves side region 44 overlaps with the upper side of the cover glass 28, and the ridge side region 45 is located on the upper side of the position adjusting glass 15. In other words, a part of the decorative glass 16 overlaps with the cover glass 28, and the rest part thereof protrudes toward the ridge side from the cover glass 28. Further, a region in which the protruding part of the decorative glass 16 is located overlaps with the position adjusting glass 15.

The area of the decorative glass 16 (the area of the upper face or the lower face) is smaller than the area of the cover glass 28 (the area of the upper face or the lower face). Thus, the area of the part of the decorative glass 16 protruding toward the ridge side is also sufficiently smaller than the area of the cover glass 28. The area of a part of the front face of the cover glass 28, the part overlapping with the decorative glass 16, is approximately half (an integral division of) the area of the cover glass 28.

As illustrated in FIG. 10, the ridge side end of the position adjusting glass 15 is located at the same position (substantially the same position) as the ridge side end of the decorative glass 16 in the ridge direction. That is, two corners of the decorative glass 16 located at the ridge side are aligned with two corners of the position adjusting glass 15 located at the ridge side, and the ridge side end of the decorative glass 16 is adjacent to the ridge side end of the position adjusting glass 15 in the up-down direction. In other words, the ridge side edge of the front face (or the rear face) of the decorative glass 16 is aligned with the ridge side edge of the front face (or the rear face) of the position adjusting glass 15.

The ridge side end of the back glass 13 is located more at the eaves side than the ridge side end of the position adjusting glass 15 and the ridge side end of the decorative glass 16. That is, a part of the position adjusting glass 15 overlaps with the back glass 13, and the rest part thereof protrudes toward the ridge side from the back glass 13. Similarly, a part of the decorative glass 16 is located above the back glass 13, and the rest part thereof protrudes toward the ridge side from the back glass 13. In other words, a space 80 in which the back glass 13 is not located is formed under the ridge side end of the position adjusting glass 15 and the ridge side end of the decorative glass 16. More specifically, the space 80 is formed in a part that is located under the ridge side part of the position adjusting glass 15 and the ridge side part of the decorative glass 16 and located more at the ridge side than the ridge side end of the back glass 13.

Accordingly, a step-like part is formed near the ridge side end of the solar cell module 4 on the rear side thereof.

Then, the exposed region 34 of the cover glass 28 and the eaves side region 44 of the decorative glass 16 are surface-treated.

Figure 11:
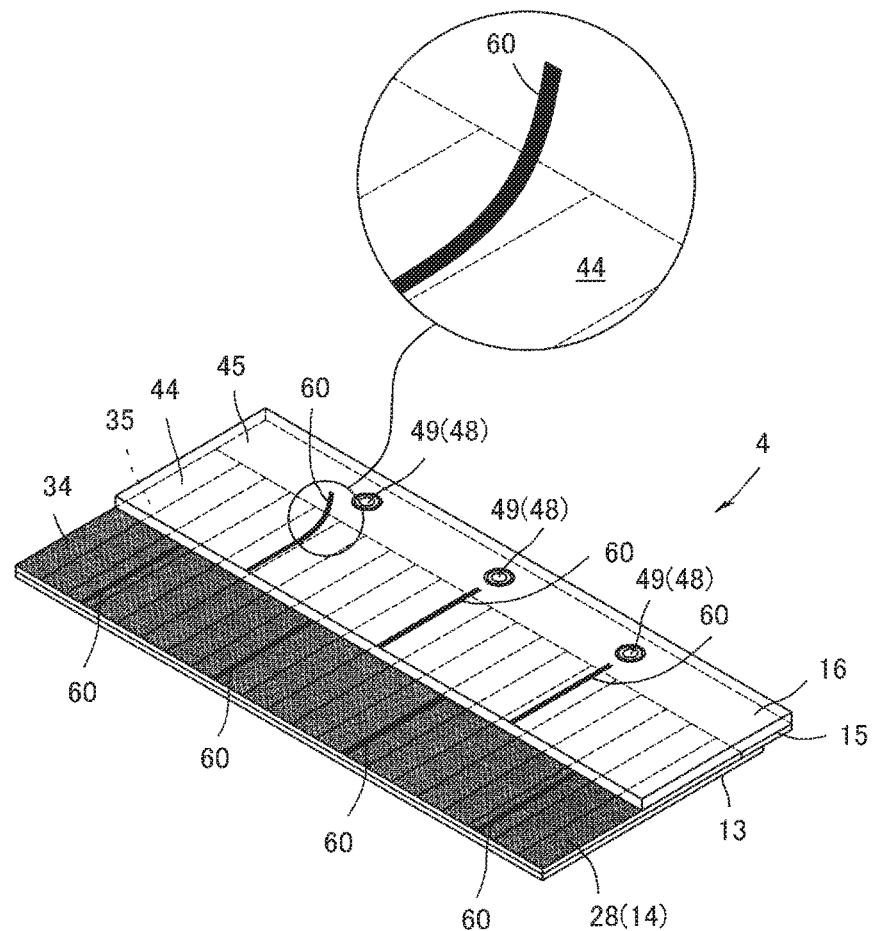
FIG. 11 is an explanatory diagram illustrating the assembly procedure of the solar cell module and illustrating a state in which masking tapes are stuck from the state of FIG. 10.

Specifically, as illustrated in FIG. 11, masking tapes 60 are stuck to predetermined parts on the surface of the exposed region 34 of the cover glass 28 and the surface of the eaves side region 44 of the decorative glass 16. All the masking tapes 60 stuck to the respective parts linearly extend in the ridge direction.

Figure 12:
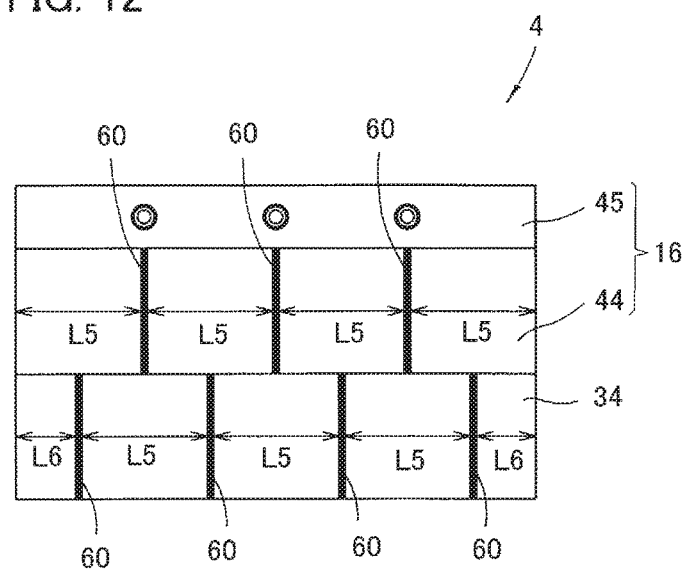
FIG. 12 is a schematic view illustrating a state in which the masking tapes have been stuck to the laminate body illustrated in FIG. 10.

As illustrated in FIG. 12, in the eaves side region 44 of the decorative glass 16, the first masking tape 60 is stuck to a position that is separated from one side end in the width direction by a predetermined distance L5. Further, the second masking tape 60 is stuck to a position that is separated from the first masking tape 60 by the predetermined distance L5 in the width direction, and the third masking tape 60 is stuck to a position that is separated from the second masking tape 60 by the predetermined distance L5 in the width direction. That is, in the eaves side region 44 of the decorative glass 16, a plurality of masking tapes 60 are arranged side by side at intervals of the predetermined distance L5. Further, in the eaves side region 44 of the decorative glass 16, the distance between the one side end in the width direction and the masking tape 60 that is closest to the one side end is also the predetermined distance L5, and the distance between the other side end and the masking tape 60 that is closest to the other side end is also the predetermined distance L5.

On the other hand, in the exposed region 34 of the cover glass 28, the distance between the masking tapes 60 is also the predetermined distance L5. However, in the exposed region 34 of the cover glass 28, the distance between one side end in the width direction and the masking tape 60 that is closest to the one side end and the distance between the other side end and the masking tape 60 that is closest to the other side end are a distance L6 which differs from the predetermined distance L5. The distance L6 is approximately half the predetermined distance L5.

That is, in both the eaves side region 44 of the decorative glass 16 and the exposed region 34 of the cover glass 28, the plurality of masking tapes 60 are arranged side by side at intervals of the predetermined distance L5. However, the distance between the end in the width direction and the masking tape 60 that is closest to the end in either one of them is half the distance in the other one. Accordingly, a row of the masking tapes 60 formed in the eaves side region 44 of the decorative glass 16 and a row of the masking tapes 60 formed in the exposed region 34 of the cover glass 28 are shifted from each other by a distance of half the arrangement interval in the width direction of the eaves side region 44 of the decorative glass 16 and the exposed region 34 of the cover glass 28.

The surface treatment is performed in such a manner that sandblast is applied to the surface of the eaves side region 44 of the decorative glass 16 and the surface of the exposed region 34 of the cover glass 28 with the masking tapes 60 stuck in this manner, and a coating agent is then applied. Then, the masking tapes 60 are peeled off to complete the solar cell module 4 as illustrated in FIG. 3.

When the surface treatment is performed, the color and the texture (surface roughness) of the surface of the surface-treated part become extremely similar to those of the slate tile 3. That is, in the present embodiment, a treatment for roughening a smooth glass surface is performed to form the surface similar to the surface of the slate tile 3 which is formed by cutting a natural rock. Accordingly, the appearance of the solar cell module 4 and the appearance of the slate tile 3 are difficult to distinguish when laid on the roof. Thus, it is possible to create a beautiful appearance having a sense of unity on the entire roof (described in detail below).

When the glass surface is roughened, although the glass surface can be brought into a surface similar to the surface of the slate tile 3, dust and dirt are prone to enter asperities on the glass surface. Thus, in the present embodiment, a coating agent is applied after sandblast to make the roughened glass surface get less dirty.

As illustrated in FIG. 8, the entire solar cell section 14 looks blackish before the surface treatment. As illustrated in FIG. 10, when the decorative glass 16 is placed on the solar cell section 14, a part of the solar cell section 14 located under the decorative glass 16 is seen through the transparent decorative glass 16. That is, since a part of the solar cell section 14 indicated by a broken line in FIG. 10 is seen through, the eaves side part (eaves side region 44) of the decorative glass 16 also looks blackish.

The part to which the masking tape 60 is stuck is not surface-treated. Thus, such a part looks blackish as before also after the surface treatment. Thus, as illustrated in FIG. 3, a part that looks black is formed on the surface of the eaves side region 44 of the decorative glass 16 and the surface of the exposed region 34 of the cover glass 28.

That is, a roughened part 61 which is roughened and a smooth part 62 which keeps smoothness are formed on the surface of the eaves side region 44 of the decorative glass 16 and the surface of the exposed region 34 of the cover glass 28. The smooth part 62 looks blackish and thus looks like a black line extending in the ridge direction.

As illustrated in FIG. 3, in the solar cell module 4 of the present embodiment, the solar cell section 14 and the cover glass 28, a part of the position adjusting glass 15, and the decorative glass 16 are present on the front side of the back glass 13.

The area of the upper face of the back glass 13 which seals the rear side of the solar cell section 14 is larger than the area of the upper face of the cover glass 28 which forms the light receiving surface. Thus, a region (the outer region 21, hereinbelow, also merely referred to as a surplus region) in which neither the cover glass 28 nor the solar cell 31 (refer to FIG. 4) is present is formed on the front face of the back glass 13 at the ridge side with respect to the part covered with the cover glass 28. Further, the position adjusting glass 15 is placed in this region. That is, the ridge side part of the back glass 13 protrudes toward the ridge side form the ridge side end of the solar cell section 14 and serves as a region for placing the position adjusting glass 15.

The area of the upper face of the back glass 13 is 1.17 times as large as the area of the upper face of the cover glass 28. The area of the surplus region is 17% of the area of the upper face of the cover glass 28. The area of the upper face of the back glass 13 is preferably 1.1 times or more and 4 times or less, compared to the area of the upper face of the cover glass 28. The area of the surplus region is preferably 10% or more and 300% or less of the area of the upper face of the cover glass 28.

Then, a construction method of the roof structure 1 of the present embodiment will be described.

Figure 13:
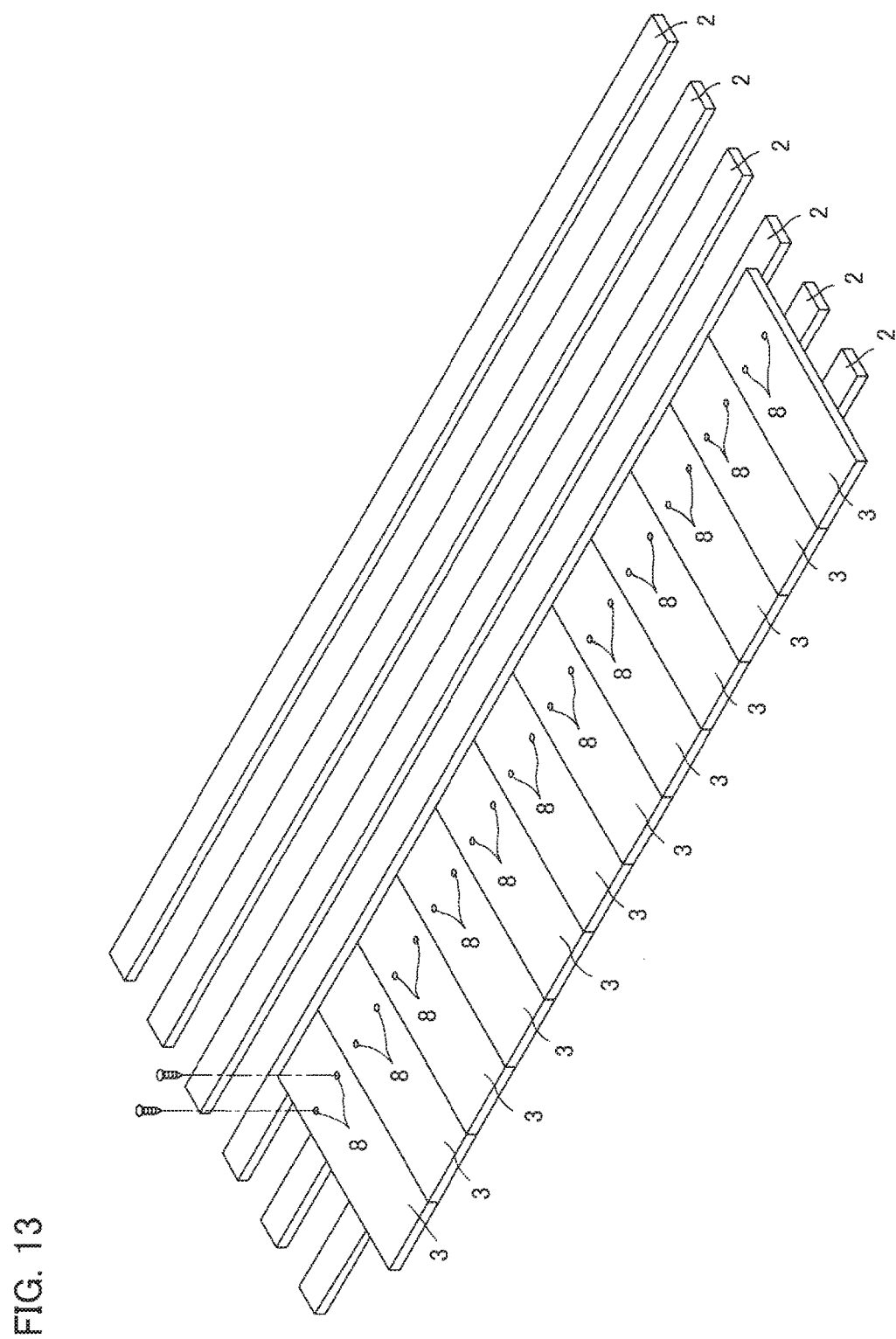
FIG. 13 is a perspective view illustrating a construction procedure of the roof structure of the present embodiment and illustrating a state in which slate tiles of the eaves side first stage have been attached.

First, as illustrated in FIG. 13, slate tiles 3 of the eaves side first stage are fixed. That is, the attachment hole 8 of each of the slate tiles 3 is brought to overlap with the purlin member 2, and a fastening element such as a wood screw or a nail is inserted into the attachment hole 8 to integrally fix the slate tile 3 and the purlin member 2 to each other. Accordingly, a plurality of slate tiles 3 are arranged side by side with no gap therebetween in the span direction at the eaves side end of the roof.

The fastening element is a superordinate concept of a screw and a nail.

Figure 14:
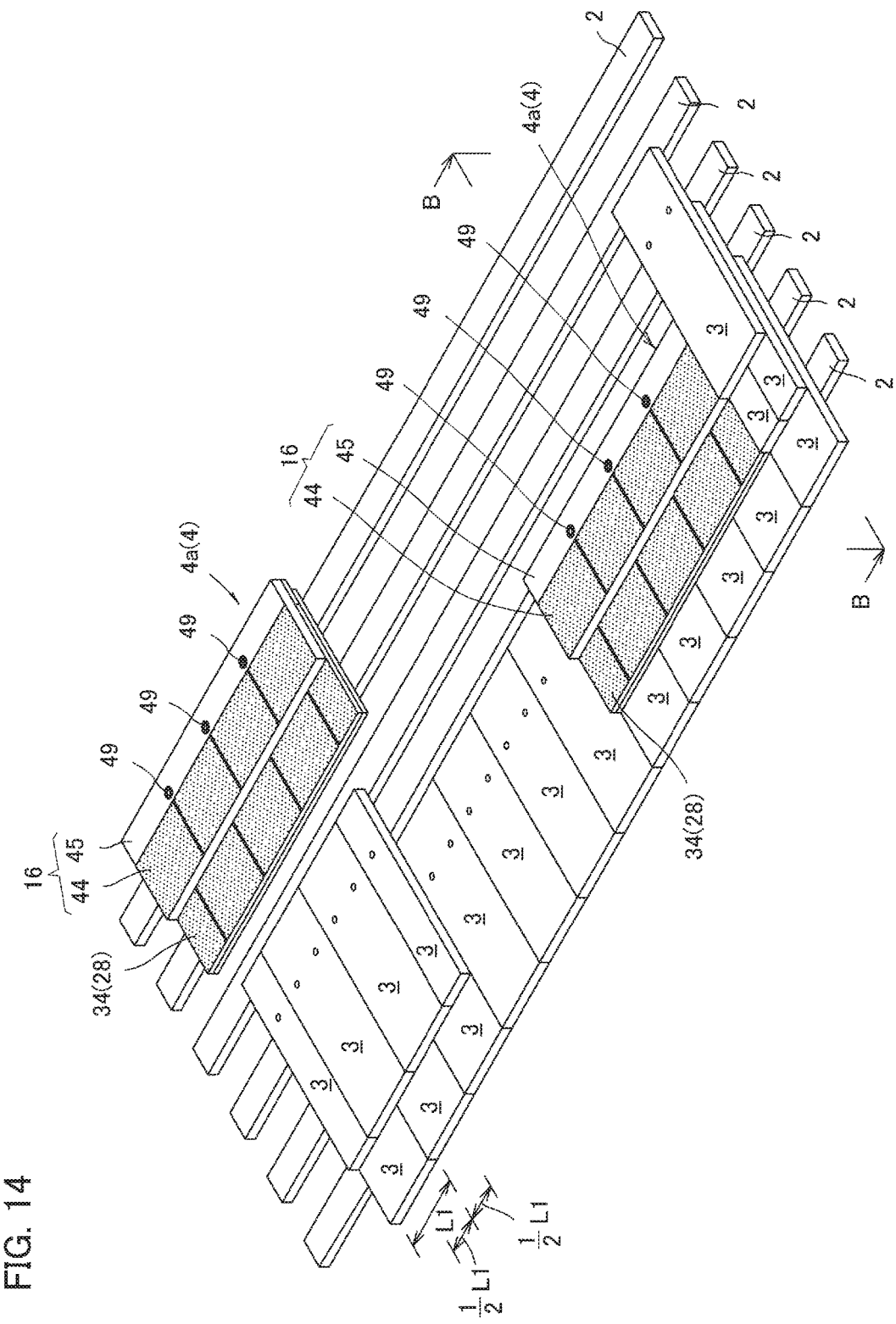
FIG. 14 is a perspective view illustrating a state in which slate tiles of the eaves side second stage and the solar cell modules are attached following FIG. 13.

Next, as illustrated in FIG. 14, slate tiles 3 of the eaves side second stage are fixed. Each of the slate tiles 3 of the eaves side second stage is also integrally fixed to the purlin member 2 by inserting a fastening element into the attachment hole 8 similarly to the slate tiles 3 of the eaves side first stage.

The ridge side part of the slate tile 3 of the eaves side first stage overlaps with the eaves side part of the slate tile 3 of the eaves side second stage. More specifically, a part that is located near the center in the width direction of the slate tile 3 arranged on the eaves side second stage and located at the eaves side is located on the upper side of a part of a boundary between adjacent slate tiles 3 of the eaves side first stage that is located at the ridge side, and these parts overlap with each other.

At this point, the attachment hole 8 of the slate tile 3 arranged on the eaves side first stage is covered with the slate tile 3 arranged on the eaves side second stage.

More specifically, one slate tile 3 which is arranged on the eaves side second stage covers one of the two attachment holes 8 formed on one of the two slate tiles 3 which are adjacent to each other on the eaves side first stage and one of the two attachment holes 8 formed on the other slate tile 3. More specifically, in the attachment holes 8 formed on each of the slate tiles 3, the attachment hole 8 that is closest to the boundary between the two slate tiles 3 is covered with the slate tile 3 of the eaves side second stage.

That is, the slate tiles 3 of the eaves side second stage are laid at positions shifted by half the tile width L1 (refer to FIG. 2) in the width direction with respect to the slate tiles 3 of the eaves side first stage. That is, in the most part of the roof structure 1 of the present embodiment, the slate tiles 3 are laid at positions shifted in the width direction between adjacent stages. In other words, in the roof structure 1 of the present embodiment, a plurality of slate tiles 3 are arranged in a step-like and staggered form.

Thus, a ridge side part of the slate tile 3 of the first stage located between the width direction center and an end at one side overlaps with an eaves side part of the slate tile 3 of the second stage located between the width direction center and an end at the other side.

Thereafter, slate tiles 3 of the eaves side third and later stages are fixed in the same manner.

Then, the solar cell module 4 is fixed so as to be arranged side by side with the slate tiles 3 of the eaves side second stage and the eaves side third stage.

More specifically, as illustrated in FIG. 14, the solar cell module 4 is fixed in such a manner that the exposed region 34 of the cover glass 28 of the solar cell module 4 is arranged side by side with the exposed part of the slate tile 3 of the eaves side second stage in the width direction (span direction), and the eaves side region 44 of the decorative glass 16 of the solar cell module 4 is arranged side by side with the exposed part of the slate tile 3 of the eaves side third stage in the width direction (span direction).

Figure 15:
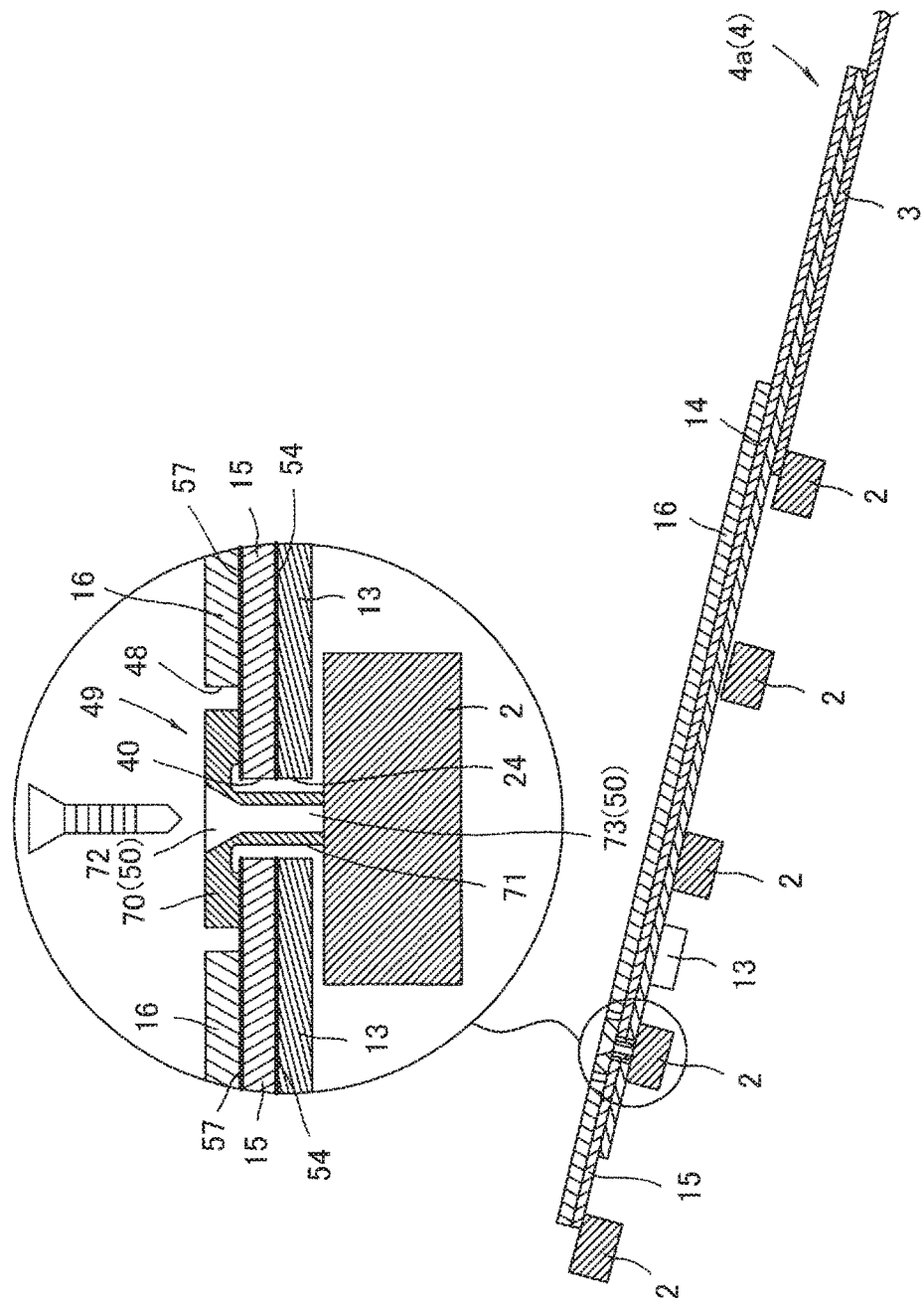
FIG. 15 is a B-B sectional view illustrating the roof structure in the state illustrated in FIG. 14.

As described above, in the solar cell module 4, the two fastening element insertion holes 24, 40 and the bushing insertion hole 48 communicate with each other to form the continuous communicating hole, and the bushing member 49 is fixed inside the communicating hole (refer to FIG. 9B, for example). That is, as illustrated also in FIG. 15, the bushing member 49 is fixed inside the communicating hole which penetrates the solar cell module 4 in the thickness direction.

When the solar cell module 4 is fixed, a fastening element is inserted into the fastening element insertion hole 50 of the bushing member 49. That is, as illustrated in FIG. 16, a fastening element such as a screw or a nail is inserted into the fastening element insertion hole 50 so that a head part of the fastening element is located inside the upper through hole 72 and a shaft part thereof is located inside the lower through hole 73. Accordingly, the solar cell module 4 and the purlin member 2 are integrally fixed.

Figure 16A:
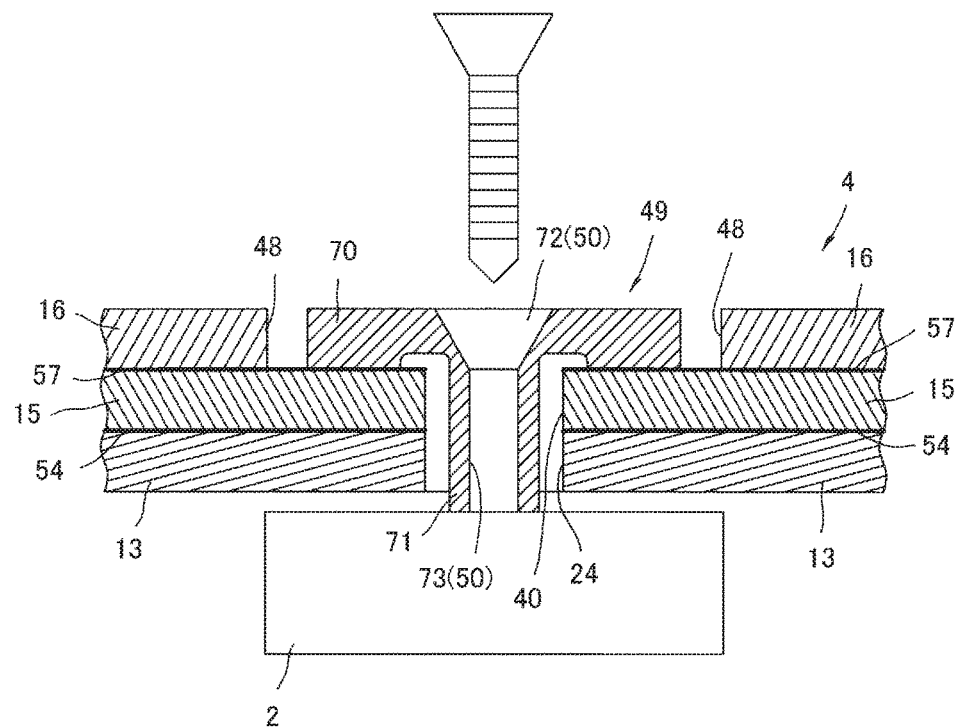

More specifically, as described above, the lower end of the bushing member 49 protrudes downward from the lower opening of the communicating hole formed by the two fastening element insertion holes 24, 40 and the bushing insertion hole 48. In other words, the tip part in the protruding direction of the cylindrical part 71 slightly protrudes downward from the lower face of the back glass 13. Thus, when the solar cell module 4 is placed on the upper side of the purlin member 2, as illustrated in FIG. 16A, the lower end of the bushing member 49 comes into contact with the upper face of the purlin member 2, and the rear face of the back glass 13 is arranged at a position separated upward from the purlin member 2.

Figure 16B:
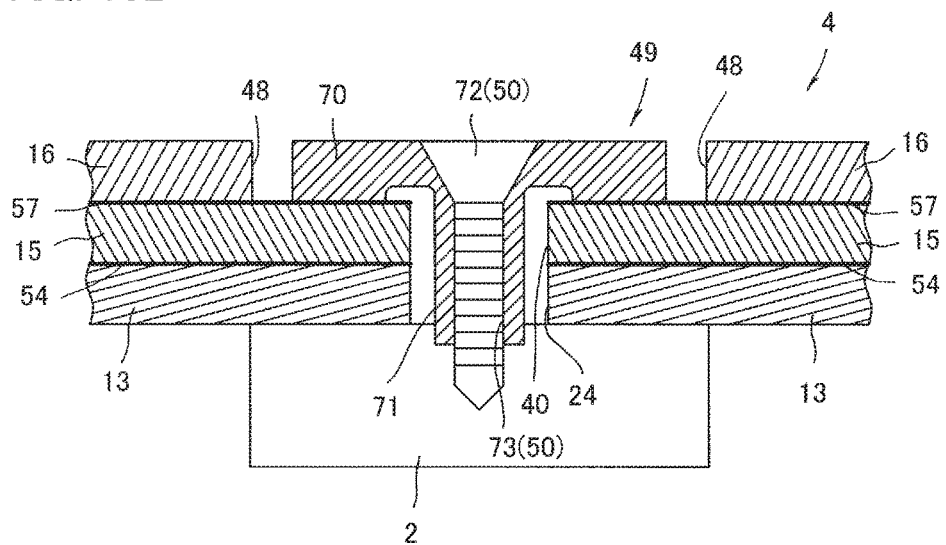

When the fastening element is inserted into the fastening element insertion hole 50 in this state, as illustrated in FIG. 16B, the lower end part of the fastening element protruding from the lower opening of the fastening element insertion hole 50 enters the inside of the purlin member 2. Along with this, the lower face of the solar cell module 4, that is, the lower face of the back glass 13 comes into contact with the upper face of the purlin member 2. At this time, the lower end part of the bushing member 49 protruding downward from the lower opening of the communicating hole sinks into the purlin member 2. That is, the bushing member 49 is pushed against the purlin member 2 to form a recess on the purlin member 2, and the lower end part of the bushing member 49 enters the recess.

With such a configuration, an impact produced by the screw-in (or the drive-in) of the fastening element is less likely to be transmitted to the back glass 13 differently from the case in which the fastening element is screwed in (or driven in) with the lower face of the back glass 13 being in contact with the upper face of the purlin member 2. Thus, damages of glass that are produced during the fixing operation of the solar cell module 4 can be reduced.

Further, in addition to the fastening element, the lower end of bushing member 49 is sunk into the purlin member 2, which enables the solar cell module 4 to be more stabilized during the fixing operation. That is, the solar cell module 4 and the purlin member 2 can be more firmly fixed to each other.

The solar cell module 4 of the present embodiment can be fixed onto the roof by completely the same method as the fixing method of the slate tile 3 in such a manner that the attachment hole is brought to overlap with the purlin member 2 and the fastening element is inserted into the attachment hole. That is, it is not necessary to perform a dedicated operation for attaching the solar cell module 4 such as fixing attachment metal fittings to the purlin member 2 and the slate tile 3. Thus, a fixing operation onto the roof is easily performed.

The solar cell module 4 of the present embodiment is fixed in such a manner that the bushing member 49 is previously disposed inside the communicating hole formed by the two fastening element insertion holes 24, 40 and the bushing insertion hole 48, and the fastening element is inserted into the fastening element insertion hole 50 of the bushing member 49. Accordingly, when the fastening element is screwed in (or pushed in), the tip part of the fastening element makes no contact with the inner peripheral surfaces of the fastening element insertion holes 24, 40, which prevents damages of the inner peripheral surfaces of the fastening element insertion holes 24, 40.

Figure 17:
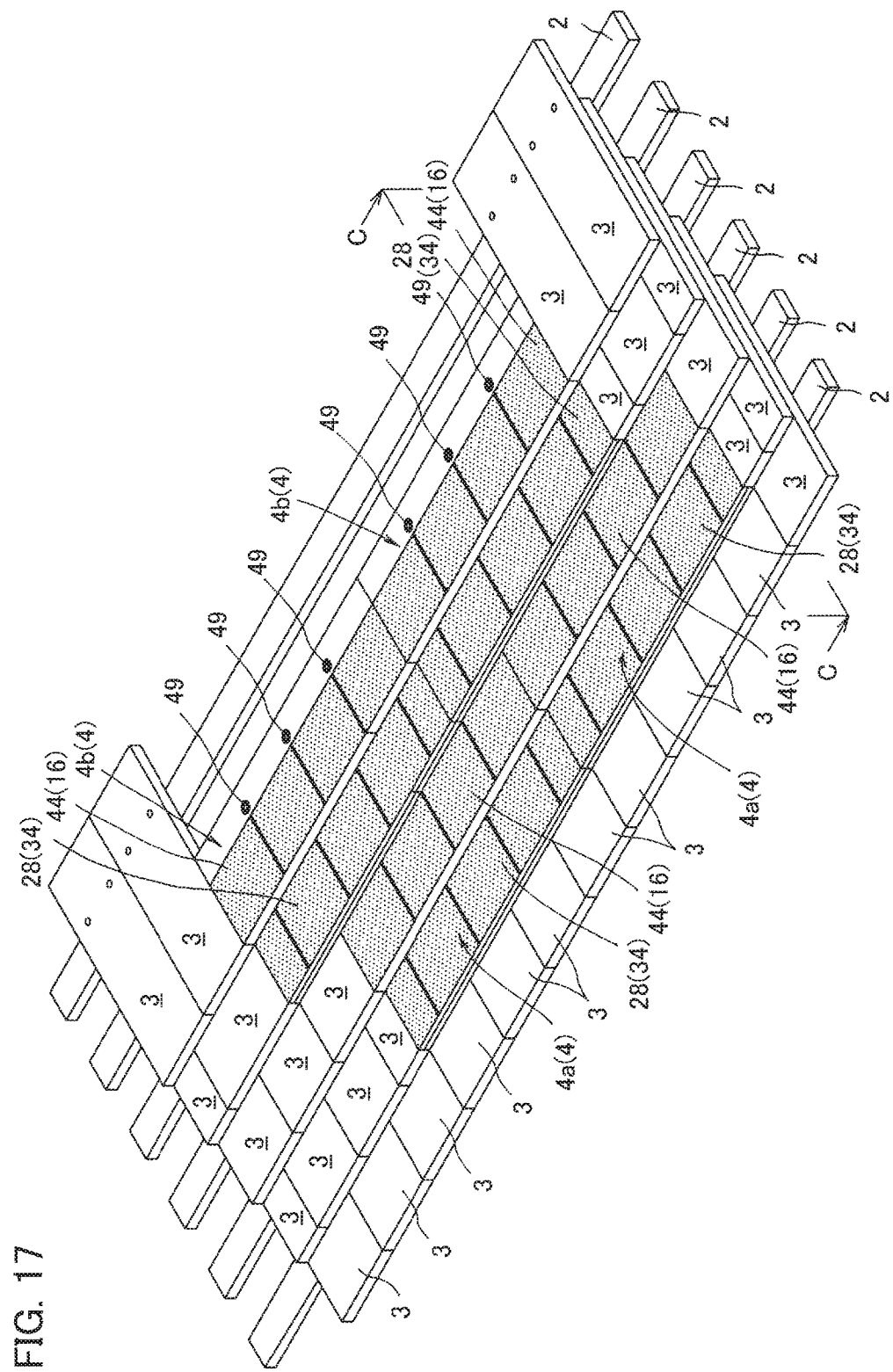
FIG. 17 is a perspective view illustrating a state in which slate tiles of the eaves side third stage and the solar cell modules of the upper stages are attached following FIG. 14.

Then, as illustrated in FIG. 17, another solar cell module 4 is additionally fixed on the upper stage of the fixed solar cell module 4.

At this time, an upper stage solar cell module 4b is fixed at a position that is shifted by the width dimension L1 (refer to FIG. 2) of the slate tile 3 in the span direction (the width direction of the solar cell module 4) with respect to a lower stage solar cell module 4a.

The upper stage solar cell module 4b and the slate tile 3 of the eaves side third stage overlap with the upper side of a part of the lower stage solar cell module 4a that is located at the ridge side with respect to the eaves side region 44 (refer to FIG. 3) of the decorative glass 16.

First, a part overlapping with the upper stage solar cell module 4b will be described.

As illustrated in FIGS. 14 and 17, the eaves side part of the upper stage solar cell module 4b overlaps with the upper side of the ridge side region 45 of the decorative glass 16 of the lower stage solar cell module 4a. In other words, the lower stage solar cell module 4a and the upper stage solar cell module 4b overlap with each other in a shifted state in the ridge direction so that the eaves side end in the ridge side region 45 of the lower stage solar cell module 4a is aligned with the eaves side end in the entire upper stage solar cell module 4b.

Figure 18:
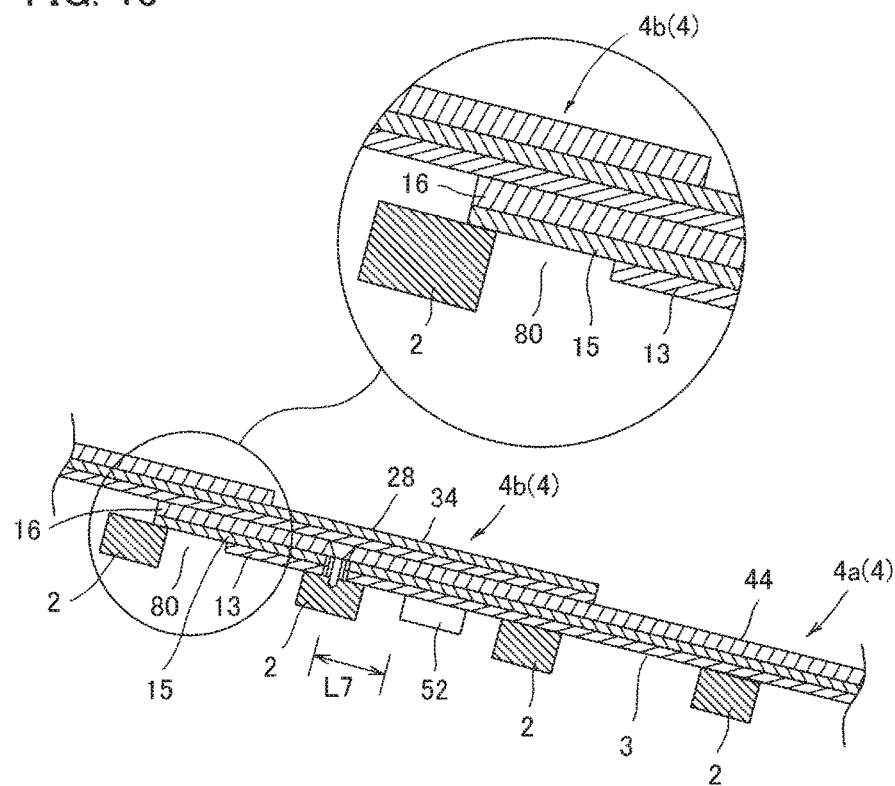
FIG. 18 is a C-C sectional view of the roof structure in the state illustrated in FIG. 17 with only a principal part enlarged.

Accordingly, as illustrated in FIG. 18, the upper side of the communicating hole in which the bushing member 49 is located and into which a fastening element is inserted is covered with the eaves side part of the upper stage solar cell module 4b.

Then, a part in which the slate tile 3 overlaps with the upper side of the ridge side region 45 of the decorative glass 16 of the lower stage solar cell module 4a will be described. Also in this case, the upper side of the communicating hole into which a fastening element is inserted is covered with the slate tile 3 similarly to the case in which the upper stage solar cell module 4b overlaps with the upper side of the ridge side region 45.

In the solar cell module 4 of the present embodiment, as illustrated in FIG. 18, the terminal box 52 is fixed to the rear side of the back glass 13. More specifically, the terminal box 52 is fixed in such a manner that the ridge side end of the terminal box 52 is located at a position separated by a predetermined distance L7 to the eaves side from the center of the communicating hole into which the fastening element is inserted. Further, the terminal box 52 protrudes downward from the rear face of the back glass 13.

The solar cell module 4 of the present embodiment is fixed to the purlin member 2 in such manner that the terminal box 52 is housed within a space formed between the purlin members 2 which are arranged side by side at a predetermined interval in the ridge direction.

A part (at least a part) of the purlin member 2 is arranged in the space 80 which is located at the ridge side with respect to the back glass 13.

Then, the slate tiles 3 are laid on the upper side of the upper stage solar cell module 4b from the state illustrated in FIG. 17. Accordingly, the roof structure 1 is formed (refer to FIG. 1).

In the roof structure 1 of the present embodiment, as illustrated in FIG. 1, a region in which only the slate tiles 3 are laid and no solar cell module 4 is arranged (hereinbelow, also referred to as a roof member laid region) and a region in which only the solar cell modules 4 are laid and no slate tile 3 is laid (hereinbelow, also referred to as a module laid region) are formed.

In the roof member laid region, a part of the lower stage slate tile 3 is located under the upper stage slate tile 3, and only the other part thereof is exposed to the outside. In the solar cell module 4 in the module laid region, only the exposed region 34 of the cover glass 28 and the eaves side region 44 of the decorative glass 16 are exposed to the outside.

Figure 19:
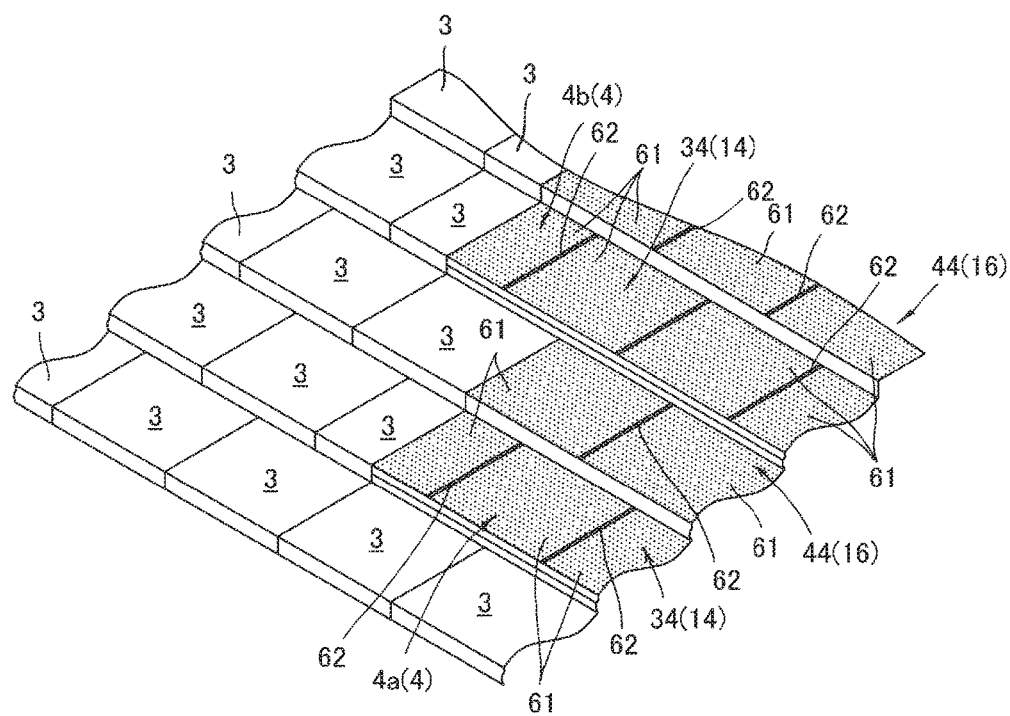
FIG. 19 is a perspective view illustrating a part A of FIG. 1 in an enlarged manner.

As illustrated, for example, in FIG. 19, in the solar cell module 4 of the present embodiment, a step is formed between the exposed region 34 of the cover glass 28 as the front face of the solar cell section 14 and the eaves side region 44 of the decorative glass 16. The step is similar to a step formed between the slate tile 3 that is located at the lateral side in the width direction of the exposed region 34 of the cover glass 28 and the slate tile 3 that is located at the lateral side in the width direction of the eaves side region 44 of the decorative glass 16.

That is, a difference of elevation formed between the upper face of the exposed region 34 of the cover glass 28 and the upper face of the eaves side region 44 of the decorative glass 16 is equal to (or substantially equal to) a difference of elevation between the upper face of the slate tile 3 located at the lateral side in the width direction of the exposed region 34 and the upper face of the slate tile 3 located at the lateral side in the width direction of the eaves side region 44.

As described above, the roughened part 61 which is surface-treated to be roughened is formed in the exposed region 34 of the cover glass 28 and the eaves side region 44 of the decorative glass 16, and the smooth part 62 which is not surface-treated is located at the edge of the roughened part 61. The roughened part 61 which is planarly distributed is extremely similar to the slate tile 3 in color and texture (surface roughness) on the surface thereof, and the smooth part 62 looks like a black line.

Thus, when looking at the exposed region 34 of the cover glass 28 and the eaves side region 44 of the decorative glass 16, the appearance thereof looks as if the slate tiles 3 were laid.

That is, the roughened part 61 which is a substantially quadrangular plane in plan view has substantially the same shape as a part that is exposed to the outside in the slate tile 3 arranged in the roof member laid region. Further, the roughened part 61 formed in the exposed region 34 of the cover glass 28 and the roughened part 61 formed in the eaves side region 44 of the decorative glass 16 are also continuous with each other through a step similarly to the exposed parts of the slate tiles 3 arranged in the roof member laid region. Since the smooth part 62 looks like a black line, the smooth part 62 looks like a shadow formed in the boundary between the slate tiles 3 arranged adjacent to each other.

Accordingly, in the roof structure 1 of the present embodiment, it is extremely difficult to visually distinguish between the roof member laid region and the module laid region, and these regions look like the same at a glance. That is, a roof having a beautiful appearance with a sense of unity on the entire roof can be formed.

In the present embodiment, the width direction length of the back glass 13 is equal to the width direction length of the position adjusting glass 15, the cover glass 28, and the decorative glass 16. Further, the position adjusting glass 15, the cover glass 28, and the decorative glass 16 are arranged closer to the eaves side of the back glass 13. That is, a region in which none of the cover glass 28, the solar cell 31 (refer to FIG. 4), and the position adjusting glass 15 are present is formed at the ridge side with respect to the position adjusting glass 15. However, the present invention is not limited thereto.

Figure 20:
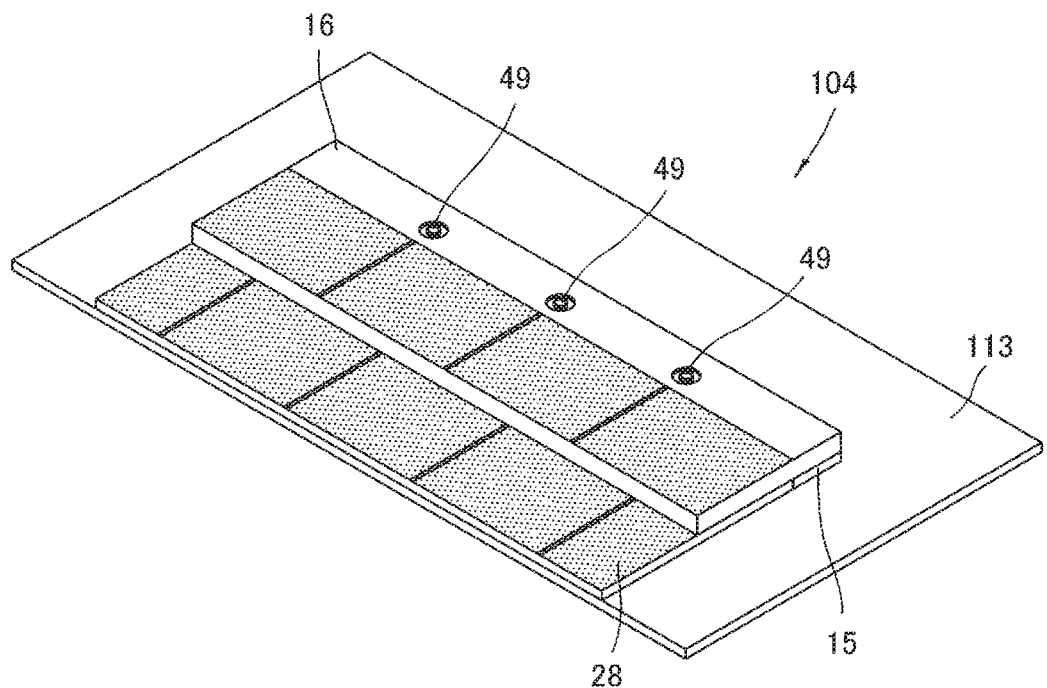
FIG. 20 is a perspective view illustrating a solar cell module having a form different from FIG. 3.

For example, as illustrated in FIG. 20, there may be employed a solar cell module 104 which includes a back glass 113 (rear face sealing plate) whose length in the ridge direction is made long so that the ridge side end of the back glass 113 is located at the ridge side with respect to the ridge side end of the position adjusting glass 15 and the ridge side end of the decorative glass 16.

In the solar cell module 104, the ridge side part of a back glass 113 protrudes toward the ridge side from the ridge side end of the position adjusting glass 15 and the ridge side end of the decorative glass 16. Thus, a region in which none of the solar cell section 14 and the cover glass 28, the position adjusting glass 15, and the decorative glass 16 are present is formed on the upper side (the front side) of the ridge side part of the back glass 113.

The width direction length of the back glass 113 may be longer than the width direction length of the position adjusting glass 15, the cover glass 28, and the decorative glass 16. That is, a region in which none of the cover glass 28, the solar cell 31 (refer to FIG. 4), and the position adjusting glass 15 are present may be formed at the outer side with respect to the width direction end of the position adjusting glass 15, the cover glass 28, or the decorative glass 16. In other words, in the solar cell module 4, a region around the end in the span direction may be the region in which none of the cover glass 28, the solar cell 31, and the position adjusting glass 15 are present.

In the above embodiment, there has been described the solar cell module 4 provided with the solar cell section 14 in which the conductive film and the semiconductor film are laminated on the rear side of the cover glass 28, and the rear side thereof is further sealed with a part of the back glass 13. That is, in the above embodiment, an example of the solar cell module 4 which is a so-called thin film solar cell module has been described. However, the present invention is not limited thereto.

For example, there may be employed a so-called crystalline solar cell module which includes a crystal silicon sealed between the cover glass 28 and the back glass 13. That is, a solar cell section in which the cover glass 28, an EVA sheet, a solar cell, an EVA sheet, and the back glass 13 are laminated in this order from the front side may be employed instead of the solar cell section 14 which includes a laminate body in which the cover glass 28, the solar cell 31, the cell EVA sheet 53, and the back glass 13 are laminated in this order from the front side. The solar cell section of the present invention may have any structure that seals the rear side with a back glass. Examples of the solar cell section include various solar cells such as a crystal silicon solar cell, a solar cell that uses a semiconductor substrate other than silicon such as GaAs, a silicon-based thin film solar cell which includes a transparent electrode layer formed on a pin junction or a pn junction of an amorphous silicon-based thin film or a crystalline silicon-based thin film, a compound semiconductor solar cell such as CIS or CIGS, a dye-sensitized solar cell, and an organic thin film solar cell which uses an organic thin film (conductive polymer).

Although, in the above embodiment, there has been described an example in which the smooth part 62 is a region that linearly extends in the ridge direction (vertical direction), the present invention is not limited thereto.

For example, the masking tape 60 may be stuck in a manner to extend in the span direction (horizontal direction) to form a smooth part as a region that extends in the span direction (horizontal direction). Alternatively, a smooth part that extends in the ridge direction (vertical direction) and a smooth part that extends in the span direction (horizontal direction) may be present together, or only one of the smooth parts may be formed.

In the above embodiment, each of the smooth parts 62 is located at the edge of the roughened part 61 having a quadrangular shape in plan view. In other words, the upper face of the exposed region 34 of the cover glass 28 and the upper face of the eaves side region 44 of the decorative glass 16 to which a plane treatment has been applied are divided into a plurality of quadrangular regions by the smooth parts 62. However, the present invention is not limited thereto.

The shape in plan view of the roughened part 61 is not limited to a substantially quadrangular shape, and may be appropriately changed according to the shape of the exposed part of the slate tile 3 which is arranged in the roof member laid region.

In the above embodiment, there has been described an example in which the position adjusting glass 15 is disposed between the decorative glass 16 and the back glass 13. However, the present invention is not limited thereto.

For example, a plate-like member made of metal may be disposed instead of the position adjusting glass 15. That is, the plate-like member disposed between the decorative glass 16 and the back glass 13 may not be made of glass.

In the above embodiment, there has been described an example in which the surface treatment that first performs sandblast and then applies a coating agent is executed. However, the present invention is not limited thereto.

For example, a resin containing fine particles may be applied to the surface of the cover glass 28 and the surface of the decorative glass 16 instead of the above surface treatment. That is, the resin containing fine particles may be applied without performing sandblast to form asperities on the glass surface so that the color and the texture (surface roughness) on the surface is brought into a state extremely similar to those of the slate tile 3.

In the above embodiment, there has been described an example in which the space 80 is formed under the ridge side end of the position adjusting glass 15 and the ridge side end of the decorative glass 16 at the ridge side with respect to the back glass 13 to form the step on the rear face of the ridge side end of the solar cell module 4 (refer to FIG. 18). However, the present invention is not limited thereto.

Figure 21:
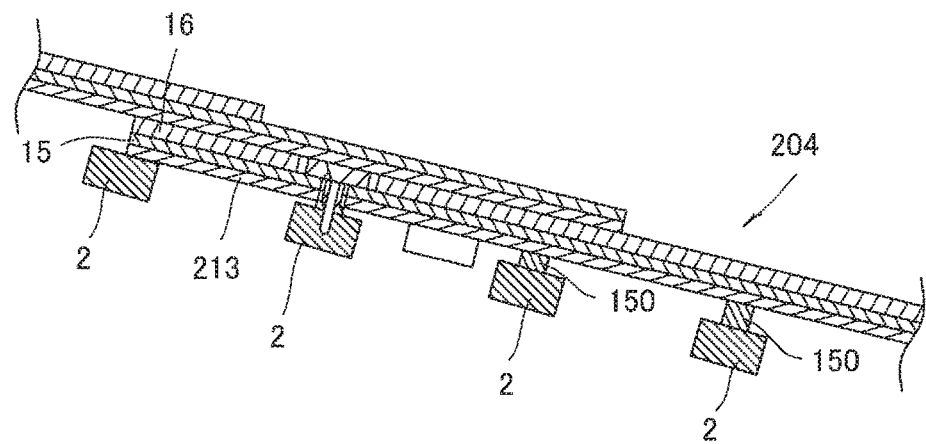
FIG. 21 is a sectional view illustrating a roof structure formed by attaching a solar cell module having a form different from FIG. 3 and FIG. 20.

For example, as illustrated in FIG. 21, there may be employed a solar cell module 204 which includes no step formed at the eaves side end on the rear face. In the solar cell module 204, the ridge side end of a back glass 213 (rear face sealing plate), the ridge side end of the position adjusting glass 15 which is located on the upper side of the back glass 213, and the ridge side end of the decorative glass 16 which is located on the upper side of the position adjusting glass 15 have the same position (substantially the same position) in ridge direction. That is, in the solar cell module 204, the ridge side edge of the front face (or the rear face) of the back glass 213, the ridge side edge of the front face (or the rear face) of the position adjusting glass 15, and the ridge side edge of the front face (or the rear face) of the decorative glass 16 are aligned. In other words, the solar cell section 14 and the cover glass 28, the entire position adjusting glass 15, and the decorative glass 16 are present on the front side of the back glass 13.

When the solar cell module 204 having such a configuration is fixed to the purlin member 2, the solar cell module 204 and the purlin member 2 may be integrally fixed with a spacer 150 disposed therebetween.

However, as described above, the configuration in which the space 80 is formed at the ridge side of the back glass 13 of the solar cell module 104 and a part of the purlin member 2 is arranged in the space 80 (refer to, for example, FIG. 18) enables the height of the surface of the solar cell module 4 to be further reduced. Thus, such a configuration is preferred. That is, in the solar cell module 104 described above, the terminal box 52 is housed between the purlin members 2 which are arranged side by side at a predetermined interval in the ridge direction and a part of the purlin member 2 is arranged in the space 80 to fix the solar cell module 4 to a lower position.

In the above embodiment, there has been described an example in which the upper stage solar cell module 4b is fixed at the position shifted by the width dimension L1 (refer to FIG. 2) of the slate tile 3 in the span direction with respect to the lower stage solar cell module 4a. That is, a shift width in the span direction between the upper stage solar cell module 4b and the lower stage solar cell module 4a is equal to the width dimension L1 of the slate tile 3. However, the present invention is not limited thereto. For example, the shift width may be twice the width dimension of the slate tile 3 (L1×2) or half the width dimension of the slate tile. These configurations may be changed according to the shape and the area of a roof on which the solar cell module 4 is laid or the number of solar cell modules 4 to be laid. However, in view of improving the beauty of the entire roof, the shift width is preferably an integral multiple of half the width dimension L1 of the slate tile 3.

Although, in the above embodiment, there has been described an example in which the surface treatment is performed with the terminal box 52 fixed to the rear side of the back glass 13, the present invention is not limited thereto. It is needless to say that the terminal box 52 may be fixed after performing the surface treatment to form the solar cell module 4.

EXPLANATION OF REFERENCE SIGNS

1: roof structure
2: purlin member (crosspiece, outer member)
3: slate tile (roof member)
4, 104, 204: solar cell module
13, 113, 213: back glass (rear face sealing plate)
15: position adjusting glass (auxiliary plate)
16: decorative glass (step forming plate)
21: outer region (surplus region)
24: fastening element insertion hole (through hole)
28: cover glass (front side transparent plate)
31: solar cell
40: fastening element insertion hole (through hole)
49: bushing member (buffer member)
52: terminal box
61: roughened part
62: smooth part

The invention claimed is:

1. A solar cell module comprising:
a front side transparent plate;
a rear face sealing plate made of glass; and
a solar cell sealed between the front side transparent plate and the rear face sealing plate,
wherein an area of the rear face sealing plate is larger than a light receiving area of the solar cell and an area of the front side transparent plate, and
wherein a surplus region in which neither the solar cell nor the front side transparent plate is present is present on a front side of the rear face sealing plate,
the solar cell module further comprising a step forming plate having a light transmissive property, the step forming plate being placed on a front side of the front side transparent plate in such a manner that a part of the step forming plate overlaps with a region in which the front side transparent plate is present and the rest part of the step forming plate protrudes from the front side transparent plate.

2. The solar cell module according to claim 1,
wherein the area of the rear face sealing plate is 1.1 times or more and 4 times or less, compared to the light receiving area of the solar cell and the area of the front side transparent plate, and
wherein an area of the surplus region is 10% or more and 300% or less, compared to the area of the front side transparent plate.

3. The solar cell module according to claim 1, further comprising an auxiliary plate having a smaller area than the area of the front side transparent plate, the auxiliary plate being arranged to be adjacent to the front side transparent plate and to overlap with a region in which the step forming plate is present.

4. The solar cell module according to claim 3, wherein the front side transparent plate and the auxiliary plate are present on the front side of the rear face sealing plate with at least a part of the auxiliary plate overlapping with an entire area of the surplus region.

5. The solar cell module according to claim 3,
wherein each of the auxiliary plate and the rear face sealing plate includes a through hole, both of the through holes communicating with each other to form a communicating hole, and
wherein the solar cell module is fixable to an external member by inserting a fastening element into the communicating hole.

6. The solar cell module according to claim 1,
wherein the front side transparent plate is a glass plate, a front face of the front side transparent plate including: a roughened part that is roughened, the roughened part being planarly distributed; and a smooth part that keeps smoothness, the smooth part linearly extending vertically and/or horizontally, and
wherein the roughened part is divided into a plurality of quadrangular shapes by the smooth part.

7. A roof structure comprising a plurality of the solar cell modules according to claim 1, the solar cell modules being laid on a top face of a building, wherein a region corresponding to the front side transparent plate of one of the solar cell modules is placed on the surplus region of another one of the solar cell modules in an overlapping manner.

8. The roof structure according to claim 7,
wherein a roof member having a water proofing property and a certain shape, and the solar cell module are used together, and
wherein the roof structure includes a region in which the roof member is laid and the solar cell module is not laid, and a region in which the solar cell module is laid and the roof member is not laid.

9. A solar cell module comprising:
a front side transparent plate;
a rear face sealing plate;
a solar cell sealed between the front side transparent plate and the rear face sealing plate; and
a step forming plate having a light transmissive property,
wherein an area of the rear face sealing plate is larger than a light receiving area of the solar cell and an area of the front side transparent plate,
wherein an area of the step forming plate is smaller than the area of the front side transparent plate, and
wherein the step forming plate is placed on a front side of the front side transparent plate in such a manner that a part of the step forming plate overlaps with a region in which the front side transparent plate is present and the rest part of the step forming plate protrudes from the front side transparent plate.

10. The solar cell module according to claim 9, wherein both the front side transparent plate and the step forming plate have a quadrangular shape, and an area of an overlapping part between the step forming plate and the front side transparent plate is approximately an integral division of the area of the front side transparent plate.

11. A roof structure comprising a plurality of the solar cell modules according to claim 9, the solar cell modules being laid on a top face of a building, wherein a region corresponding to the front side transparent plate of one of the solar cell modules is placed on the step forming plate of another one of the solar cell modules in a shifted manner.

12. The roof structure according to claim 11, wherein the roof structure includes: a region in which a roof member having a water proofing property and a certain shape is laid and the solar cell module is not laid; and a region in which the solar cell module is laid and the roof member is not laid.

13. A solar cell module comprising:
a front side transparent plate;
a rear face sealing plate;
a solar cell sealed between the front side transparent plate and the rear face sealing plate; and
an auxiliary plate,
wherein an area of the rear face sealing plate is larger than a light receiving area of the solar cell and an area of the front side transparent plate,
wherein an area of the auxiliary plate is smaller than the area of the front side transparent plate, the auxiliary plate being placed in a region adjacent to the front side transparent plate,
wherein the front side transparent plate and the auxiliary plate are present on the front side of the rear face sealing plate, each of the auxiliary plate and the rear face sealing plate having a through hole, both of the through holes communicating with each other to form a communicating hole, and
wherein the solar cell module is fixable to an external member by inserting a fastening element into the communicating hole,
the solar cell module further comprising a step forming plate having a light transmissive property, a part of the step forming plate overlapping with the front side transparent plate, wherein the auxillary plate is placed in a region in which the step forming plate is present in an overlapping manner.

14. The solar cell module according to claim 13, wherein a buffer member is disposed inside the communicating hole.

15. The solar cell module according to claim 13, further comprising:
- a plurality of the communicating holes formed in a row; and
- a terminal box,
- wherein the terminal box protrudes from the rear face sealing plate, and
- wherein a position of the terminal box is separated by a certain distance toward the front side transparent plate from a region in which the communicating holes are formed in a row.

16. A roof structure comprising the solar cell module according to claim 15, the solar cell module being laid on a top face of a building,
- wherein a plurality of crosspieces are disposed parallel to each other on the top face of the building, the solar cell module being placed on the crosspieces,
- wherein the fastening element protrudes from the communicating hole and is joined to the corresponding crosspiece to fix the solar cell module to the crosspiece, and
- wherein the terminal box is arranged in a gap between the crosspieces parallel to each other.

* * * * *